(12) United States Patent
Takagi et al.

(10) Patent No.: US 7,390,158 B2
(45) Date of Patent: Jun. 24, 2008

(54) HANDLING DEVICE FOR ELECTRONIC CHIP COMPONENTS AND HANDLING METHOD FOR ELECTRONIC CHIP COMPONENTS

(75) Inventors: Yutaka Takagi, Shimane-ken (JP); Eiji Karino, Shimane-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 333 days.

(21) Appl. No.: 10/809,679

(22) Filed: Mar. 26, 2004

(65) Prior Publication Data
US 2004/0187446 A1 Sep. 30, 2004

(30) Foreign Application Priority Data
Mar. 28, 2003 (JP) .............................. 2003-091539
Nov. 27, 2003 (JP) .............................. 2003-397695

(51) Int. Cl.
B07C 5/02 (2006.01)

(52) U.S. Cl. .................... 414/222.01; 414/781; 209/573; 198/394; 221/163

(58) Field of Classification Search ................ 414/292, 414/304, 752.1, 222.01, 223.01, 781; 198/382, 198/394; 209/540, 573; 221/163, 171, 172
See application file for complete search history.

(56) References Cited

U.S. PATENT DOCUMENTS

| | | | | |
|---|---|---|---|---|
| 2,807,350 A | * | 9/1957 | Rayburn et al. | ............. 198/391 |
| 4,988,256 A | * | 1/1991 | Smith et al. | ............. 414/222.01 |
| 5,568,870 A | * | 10/1996 | Utech | ......................... 209/573 |
| 5,842,579 A | | 12/1998 | Garcia et al. | |
| 6,019,564 A | * | 2/2000 | Kiyokawa et al. | ........ 414/223.01 |
| 6,121,118 A | * | 9/2000 | Jin et al. | ....................... 438/460 |
| 6,801,032 B2 | | 10/2004 | Miyamoto | |
| 6,871,394 B2 | * | 3/2005 | Barretto et al. | ................ 29/830 |
| 7,017,731 B2 | * | 3/2006 | Ikeda et al. | ............... 198/464.3 |
| 7,065,864 B2 | * | 6/2006 | Yamamoto et al. | ............ 29/743 |
| 7,119,299 B2 | * | 10/2006 | Kojima et al. | ................ 209/573 |
| 2003/0056363 A1 | * | 3/2003 | Yamamoto et al. | ............ 29/592 |
| 2003/0060021 A1 | * | 3/2003 | Kurosawa et al. | ............ 438/455 |
| 2005/0062466 A1 | | 3/2005 | Miyamoto | |
| 2006/0103151 A1 | * | 5/2006 | Usui et al. | ................. 294/64.1 |

FOREIGN PATENT DOCUMENTS

| | | | |
|---|---|---|---|
| JP | 59-118615 A | | 7/1984 |
| JP | 63295323 A | * | 12/1988 |
| JP | 2003-012139 A | | 1/2003 |
| JP | 3426246 | | 5/2003 |
| WO | WO 200143523 A1 | * | 6/2001 |

OTHER PUBLICATIONS

Official communication issued in the counterpart Japanese Application No. 2003-397695, mailed on Oct. 2, 2007.

* cited by examiner

*Primary Examiner*—James Keenan
(74) *Attorney, Agent, or Firm*—Keating & Bennett, LLP

(57) ABSTRACT

A handling device for electronic chip components includes an indexing table having a plurality of cavities for holding electronic chip components therein and a circulatory feeder for supplying the electronic chip components to the indexing table. One or more cavities are simultaneously disposed at a location which comes close to the circulatory feeder and, by performing a suction operation in the cavities, the electronic chip components are directly put into the cavities, without moving the electronic chip components along the main surface of the indexing table.

33 Claims, 23 Drawing Sheets

HANDLING DEVICE FOR ELECTRONIC CHIP COMPONENTS AND HANDLING METHOD FOR ELECTRONIC CHIP COMPONENTS

BACKGROUND OF THE INVENTION

1. Field of the Invention

The present invention relates to a handling device for electronic chip components and a handling method for electronic chip components.

2. Description of the Related Art

A device for measuring electrical characteristics of electronic chip components such as chip capacitors, etc., and for screening conforming and nonconforming electronic chip components based on the measurements is described in PCT Japanese Translation Patent Publication No. 2000-501174.

As shown in FIG. 23, such a device 101 contains a test plate 102 in which a plurality of holes (cavities) 103 is arranged along concentric circles for accommodating electronic chip components. A reduced pressure from a reduced pressure source is applied to each cavity 103 of the test plate 102 and, because of the suction generated by the reduced pressure, each cavity 103 sucks and holds a electronic chip component. Furthermore, the test plate 102 is inclined so as to put the electronic chip components into the cavities 103, as is described later.

When a plurality of electronic chip components in a hopper 122 drops by their own weight onto the test plate 102 rotating clockwise, through a supplying tray 118 as a feeder, the electronic chip components move by rolling along the loading guide plates of a loading frame 104. When the electronic chip components are put into empty cavities 103 of the test plate 102, the electronic chip components are held in the cavities 103 because of the suction generated by the reduced pressure.

However, in the device 101 described in PCT Japanese Translation Patent Publication No. 2000-501174, since the electronic chip components are put into the cavities 103 by making the electronic chip components move by rolling on the test plate 102, a large area for putting the electronic components into the cavities 103 is required. Therefore, no large measurement area is available on the test plate 102 and, as a result, it is difficult to perform measurements quickly.

Furthermore, in the device 101 in PCT Japanese Translation Patent Publication No. 2000-501174, since it is required to make electronic chip components drop by their own weight, when the size and weight of the electronic components increase, the impact force of the drop increases and there is a risk that the corner portions of the electronic components may be chipped.

Furthermore, in general feeders for electronic chip components, it is required to perfectly align electronic chip components and move the electronic components to the cavities. Accordingly, in the related feeders for electronic chip components, since a system for screening electronic chip components depending on the length direction (L direction), the width direction (W direction), and the thickness direction (T direction) is contained, the feeder is easily blocked with electronic components and the rate of operation of the device is low.

SUMMARY OF THE INVENTION

In order to overcome the problems described above, preferred embodiments of the present invention provide a handling device for electronic chip components and a handling method for electronic chip components in which electrical characteristics of the electronic chip components can be quickly measured and damage to the electronic components is prevented.

According to a preferred embodiment of the present invention, a handling device for electronic chip components includes an accommodating device having a plurality of cavities for putting electronic chip components therein to, and a feeder for supplying the electronic chip components to the accommodating device. In the handling device, the accommodating device can be moved and two or more cavities are simultaneously disposed at a location which comes close to the feeder, and the electronic chip components are put into the cavities from the feeder by performing a suction operation in the cavities.

Furthermore, a handling device for electronic chip components according to a preferred embodiment of the present invention includes an accommodating device having a plurality of cavities for putting electronic chip components therein to, and a feeder for supplying the electronic chip components to the accommodating device. In the handling device, the accommodating device can be moved and at least one of the cavities is successively disposed at a location which is the closest to the feeder. On a transport surface of the feeder, the electronic chip components are supported on only one side surface thereof, without fixing the orientation of the length direction of the electronic chip components. The electronic chip components are put into the cavities from the feeder by performing a suction operation in the cavities.

Furthermore, a handling device for electronic chip components according to a preferred embodiment of the present invention includes an accommodating device having a plurality of cavities for putting electronic chip components therein to, and a feeder for supplying the electronic chip components to the accommodating device. In the handling device, the accommodating device can be moved and at least one of the cavities is successively disposed at a location which is the closest to the feeder. On a transport surface of the feeder, the electronic chip components, which preferably have a substantially square pillar shape, for example, are arranged with any orientation of the width direction and the thickness direction thereof and are supported on only one side surface thereof, without determining the orientation of the length direction of the electronic chip components. The electronic chip components are put into the cavities from the feeder by performing a suction operation in the cavities.

Furthermore, a handling device for electronic chip components according to a preferred embodiment of the present invention includes an accommodating device having a plurality of cavities for putting electronic chip components therein to, and a feeder for supplying the electronic chip components to the accommodating device. In the handling device, the accommodating device can be moved and at least one of the cavities is successively disposed at a location which comes close to the feeder. The electronic chip components are made to float in air by a floating device of the feeder and, by performing a suction operation in the cavities, the electronic chip components in the air are put into the cavities.

The feeder is preferably a circulatory feeder in which the electronic chip components can be moved freely without concern for the orientation thereof and the electronic chip components can be put into the cavities in any orientation. When the electronic chip components are put into the cavities from the feeder, the electronic chip components are directly put into the cavities without moving along the main surface of the accommodating device. The accommodating device is preferably a rotating disk-shaped component having a main surface, and the cavities are arranged so as to come to a location close to the feeder by the rotation.

Furthermore, the accommodating device is preferably arranged so as to be able to rotate substantially vertically. Alternatively, the main surface of the accommodating device is inclined such that the angle between the main surface of the accommodating device and the transport surface of the feeder increases. Another alternative is that the transport surface of the feeder has a descending inclination toward the accommodating device and the main surface of the accommodating device is inclined such that the angle between the main surface of the accommodating device and the transport surface of the feeder increases.

Furthermore, the end portion of the electronic chip components put or waiting to be put into the cavities of the accommodating device preferably protrudes to the transport passage of the feeder.

Moreover, regarding a plurality of electronic chip components being transported by the feeder, in order that the density of electronic chip components in the vicinity of cavities of the accommodating device may be made a target value, a dispersing device for dispersing the electronic chip components is provided.

Furthermore, a handling device for electronic chip components according to a preferred embodiment of the present invention includes an accommodating device having a plurality of cavities, a transport portion for transporting the electronic chip components to the cavities in the accommodating device, a suction block having a transport passage linked to the transport portion therein and putting the electronic chip components into the transport passage by a suction operation, and a feeder for supplying the electronic chip components to the vicinity of the entrance of the transport passage of the suction block. In the handling device, the feeder is preferably a circulatory feeder in which the electronic chip components are able to move freely about the orientation thereof and the electronic chip components are able to be supplied to the transport passage of the suction block in a free order.

Furthermore, a handling device for electronic chip components according to another preferred embodiment of the present invention includes an accommodating device having a plurality of cavities for putting electronic chip components therein to, and a feeder for supplying the electronic chip components to the accommodating device. In the handling device, the accommodating device can be moved and at least one of the cavities is successively disposed at a location which is the closest to the feeder. The feeder is preferably a circulatory feeder in which the electronic chip components are able to move freely with any orientation thereof and the electronic chip components are able to be supplied to the cavities regardless of their orientation and in any order. By performing a suction operation in the cavities, the electronic chip components are directly put into the cavities from the feeder without moving along the main surface of the accommodating device.

In the handling devices for electronic chip components according to preferred embodiments described above, electrical characteristics of the electronic chip components put into the cavities are preferably measured.

Furthermore, a handling method for electronic chip components according to yet another preferred embodiment of the present invention includes the step of putting electronic chip components into an accommodating device having a plurality of cavities from a feeder for supplying the electronic chip components. In the handling method, by performing a suction operation in two or more cavities simultaneously disposed at a location which is close to the feeder, electronic chip components are put into the cavities from the feeder.

Furthermore, a handling method for electronic chip components according to another preferred embodiment of the present invention includes the step of putting electronic chip components into an accommodating device having a plurality of cavities from a feeder for supplying the electronic chip components. In the handling method, by performing a suction operation in at least one cavity disposed at a location which is the closest to the feeder, the electronic chip components are directly put into the cavities from the feeder without moving along the main surface of the accommodating device.

According to various preferred embodiments of the present invention, since a large measurement area can be secured in the accommodating device, it is possible to perform measurements quickly. Furthermore, since electronic chip components can be directly put into cavities of the accommodating device without moving along the main surface of the accommodating device, damage to the electronic chip components is minimized and cracks and chips in the electronic chip components can be prevented. Furthermore, without making the electronic chip components perfectly aligned in the vicinity of the cavities, the electronic chip components can be put into the cavities because of the operation of suction in the cavities.

Other features, elements, characteristics, steps and advantages of the present invention will become more apparent from the following detailed description of preferred embodiments thereof with reference to the attached drawings.

DETAILED DESCRIPTION OF PREFERRED EMBODIMENTS

Hereinafter, preferred embodiments of a handling device for electronic chip components and a handling method for electronic chip components according to the present invention are described with reference to the accompanying drawings. Moreover, a laminated capacitor is described as an example of electronic chip components (hereinafter called chip components), but it goes without saying that, instead of the capacitor, an inductor, LC noise filter, common-mode choke coil, high-frequency composite component, or other element may be considered and used in the present invention.

First Preferred Embodiment, FIGS. 1 to 5

Figure 1:
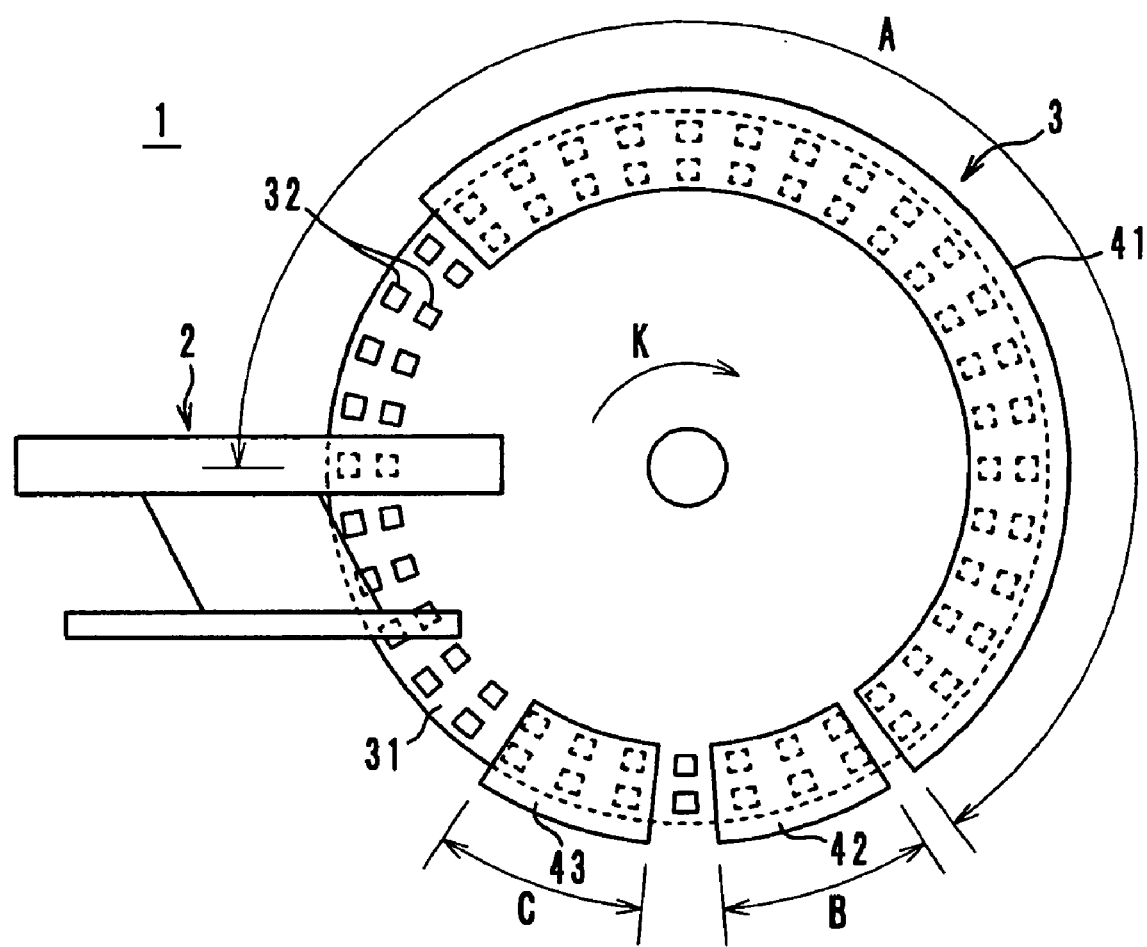
FIG. 1 is a schematic front view showing a first preferred embodiment of a handling device for electronic chip components according to the present invention.
Figure 2:
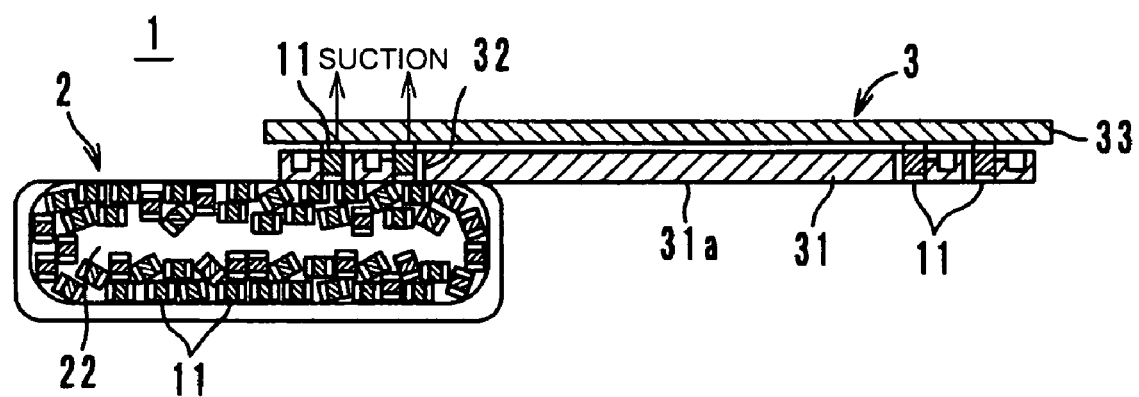
FIG. 2 is a horizontal sectional view of the handling device for electronic chip components shown in FIG. 1.

FIG. 1 is a front view of a handling device 1 for electronic chip components and FIG. 2 is a horizontal sectional view of the handling device 1. The handling device 1 for electronic chip components includes a circulatory feeder 2 (supplying feeder) and an indexing table 3 (accommodating device).

The circulatory feeder 2 includes a transport surface 22 having a large area where a plurality of chip components 11 is freely movable, and is substantially horizontally disposed. When the circulatory feeder 2 is vibrated in a fixed direction, the plurality of chip components 11 is successively moved clockwise (see FIG. 3). The plurality of chip components 11 can be moved in a fixed direction by force and also can be moved in random directions. In the circulatory feeder 2, there is an opening portion 21 having a width which is larger than the total width of the opening portions of two cavities 32 to be described later. The width of the opening portion 21 is approximately two to five times as large as the dimension in the length direction (L direction) of a chip component 11, for example. The circulatory feeder 2 screens the chip components 11 based on only the orientation of the width direction (W direction) and the thickness direction (T direction) of the chip components 11, and the orientation of the length direction (L direction) does not matter. When the chip components 11 have a substantially square pillar shape, as in the first preferred embodiment, the screening of the orientation of the W direction and the T direction is not required.

The indexing table 3 includes a disk-shaped rotor 31 having a main surface 31a which is in contact with the circulatory feeder 2 and a vacuum ring 33 having substantially the same shape as the rotor 31, which is disposed on the back side of the rotor 31. The indexing table 3 is disposed so as to be substantially vertical (for example, the indexing table 3 is inclined at about three degrees from upright) and rotates clockwise (in the direction of an arrow K).

In the peripheral portion of the rotor 31, a plurality of cavities (through-holes) 32 in two rows is disposed at regular intervals along two concentric circles. Each cavity 32 has an opening portion which is slightly larger than the dimension W in the width direction and the dimension T in the thickness direction of the chip components 11, and has a thickness which is slightly smaller than the dimension L in the length direction. Accordingly, the dimension L in the length direction of the chip components 11 is slightly protruded from the cavities 32. Moreover, the opening portion of the cavities 32 may be tapered so that the chip components 11 can be easily put into the cavities 32.

Figure 3:
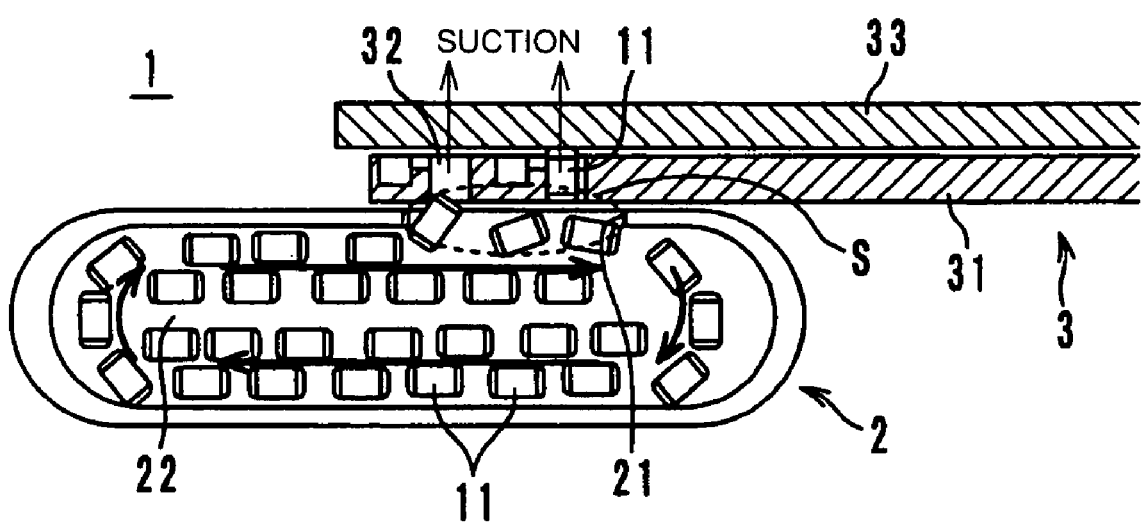
FIG. 3 is a schematic illustration showing a method for putting electronic chip components into cavities.

Although not illustrated in the vacuum ring 33 shown in FIG. 3, a plurality of suction holes or suction grooves corresponding to the cavities 32 of the rotor 31 is disposed at regular intervals along two concentric circles. Each suction hole or suction groove is provided with a reduced pressure from a pressure reducing device (not illustrated) such as a vacuum pump, etc. and, because of the suction by the reduced pressure, the inside of the cavities 32 or the vicinity S (an area enclosed by a dotted line in FIG. 3) of the cavities 32 linked to the suction holes or grooves constitutes a suction area. The chip components 11 are held and positioned in the cavities 32 by the suction generated by the reduced pressure.

Moreover, in FIG. 1, the cavities 32 in a measurement area (an area shown by a double-headed arrow A), extending from the 9-o'clock to 5-o'clock positions, in the indexing table 3 are sucked at all times and the cavities 32 in discharge areas (areas shown by double-headed arrows B and C), extending from the 5-o'clock to 7-o'clock positions, are properly changed from a reduced-pressure state to a normal pressure state.

Next, the general operation of the handling device is described. The chip components 11 are successively moved by the circulatory feeder 2 and the chip components 11 are always supplied to the vicinity S of cavities 32 of the indexing table 3. At this time, it is not required to make the chip components 11 perfectly align. The chip components 11 are directly put into the cavities 32 from the circulatory feeder 2, without being moved along the main surface 31a, because of the negative pressure generated in the vicinity S of the cavities 32. Moreover, the circulatory feeder 2 may be in contact with the indexing table in the vicinity S or a small space may be present between the circulatory feeder 2 and the indexing table 3. In either case, when both are close to each other, it is possible to directly put the chip components 11 to the cavities 32 from the circulatory feeder 2 by the action of suction.

When the indexing table 3 rotates clockwise, a measurement portion 41 for measuring electrical characteristics is provided at a first position on the transport route for the chip components 11. In the case of laminated chip capacitors, for example, the electrical characteristics such as capacitance, withstand voltage, insulation resistance, etc., are measured at the measurement portion 41. For that purpose, although not illustrated, the measurement portion 41 is provided with measuring terminals which are to be in contact with the external electrodes of chip components 11.

At a second portion on the transport route in the indexing table 3, a discharge portion 42 for discharging nonconforming components, regarding the electrical characteristics, is provided. The discharge portion 42 for nonconforming components discharges chip components 11 which are judged nonconforming in the measurement portion 41. The measurement data obtained in the measurement portion 41 is sent to a control device and, when the measurement data are judged nonconforming by the control device, a nonconforming signal is output from the control device. In this way, the chip components 11 are compulsorily discharged by the discharge portion 42 for discharging nonconforming components.

At a third position on the transport route in the indexing table 3, a discharge portion 43 for discharging conforming components, regarding the electrical characteristics, is provided. The discharge portions 43 for conforming components discharges chip components 11 which are judged conforming in the measurement portion 41. As described above, the measurement data from the measurement portion 41 is sent to the control device and, when the chip component 11 in the measurement portion 41 for the electrical characteristics is judged conforming, a conforming signal is output from the control device. Then, the chip component 11 is compulsorily discharged by the discharge portion 43 for conforming components.

Thus, a series of processes such as measurement of electrical characteristics and screening of conforming and nonconforming components can be performed by using the handling device 1.

In the handling device 1 having the above-described construction, since the chip components 11 are not dropped on the main surface 31a of the indexing table 3 and are not allowed to roll over or along the main surface 31a of the indexing table 3, the mechanical shock to the chip components 11 is very small and defects such as cracks, chips, etc., are reliably prevented from occurring in the chip components 11.

Furthermore, since the area in which the chip components are put in the indexing table 3 is small, the measurement area can be made larger. As a result, a series of processes such as measurement of electrical characteristics and screening of conforming and nonconforming components can be quickly performed.

Moreover, in the related handling device, after a chip component has been supplied, before the chip component is put in the cavity, a time for the chip component to move by rolling on and along the main surface of the test table is required. In contrast to that, in the handling device 1 according to the first preferred embodiment of the present invention, since the chip component 11 supplied to the vicinity of the cavities is quickly put into the cavity 32 by the action of suction, the insertion of the chip component 11 can be performed in a short time.

Figure 4:
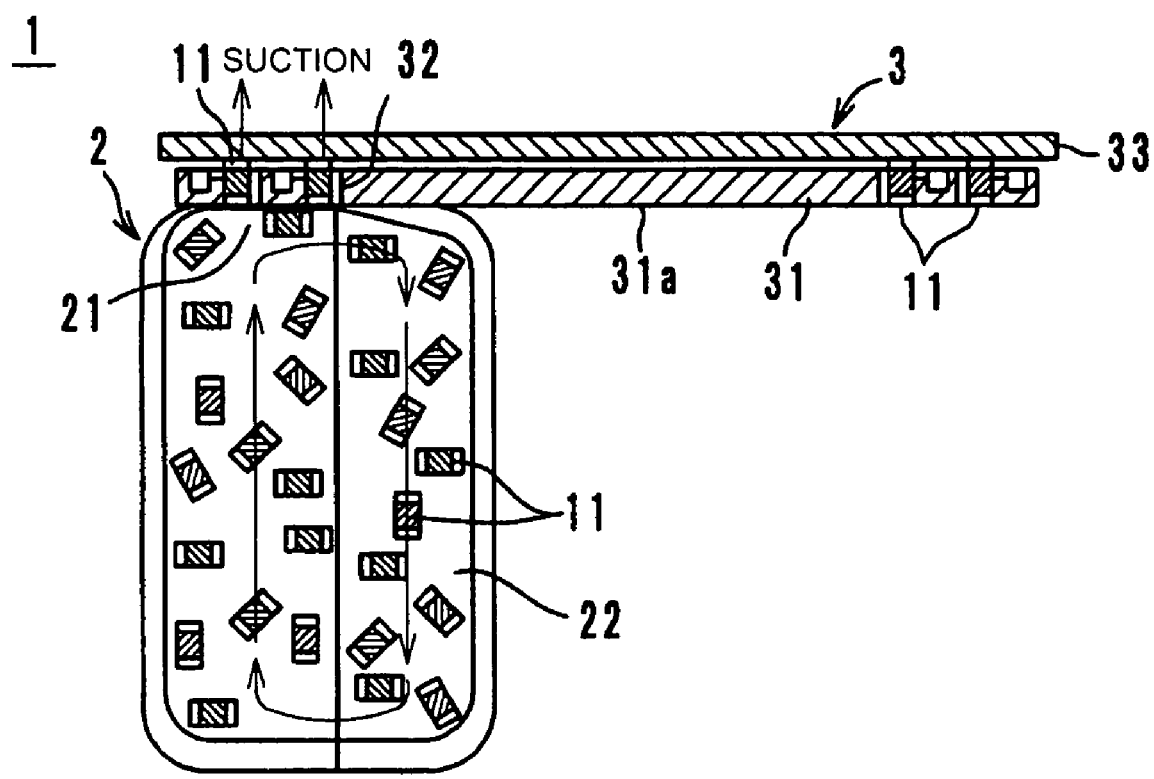
FIG. 4 is a horizontal sectional view showing a modified example of the handling device for electronic chip components shown in FIG. 1.
Figure 5:
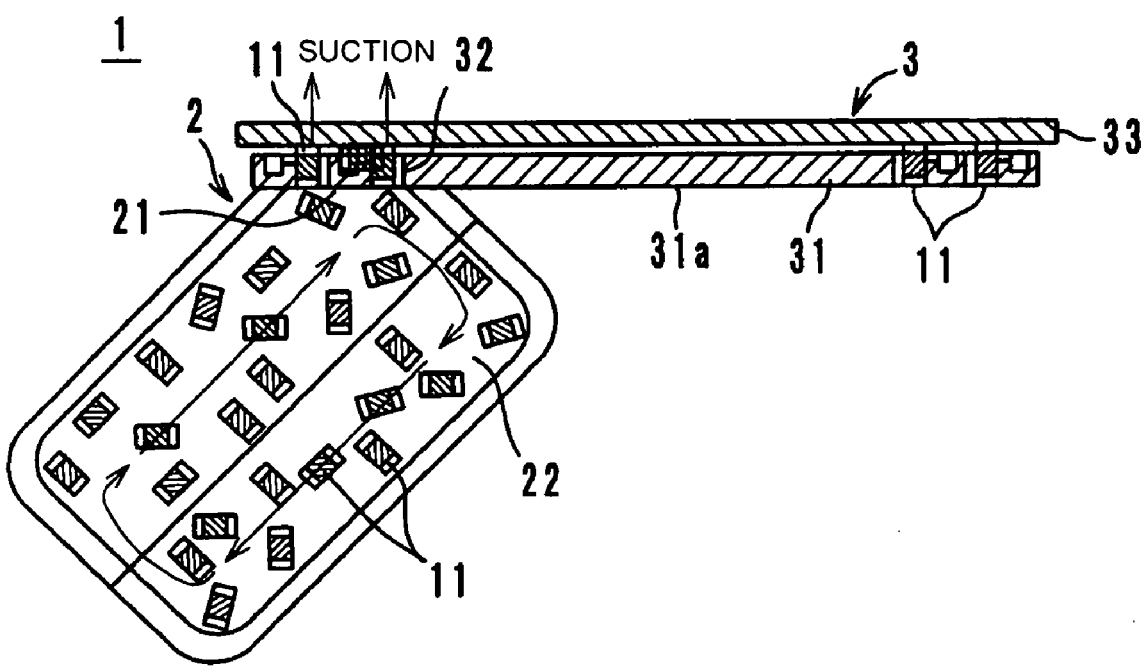
FIG. 5 is a horizontal sectional view showing another modified example of the handling device for electronic chip components shown in FIG. 1.

Furthermore, the transport route in the circulatory feeder 2 is not necessarily required to be parallel or substantially parallel to the main surface 31a of the indexing table 3. The transport route may be perpendicular or substantially perpendicular to the main surface 31a of the indexing table 3 as shown in FIG. 4, and also, the transport route may be inclined against the main surface 31a of the indexing table 3 as shown in FIG. 5.

Figure 6:
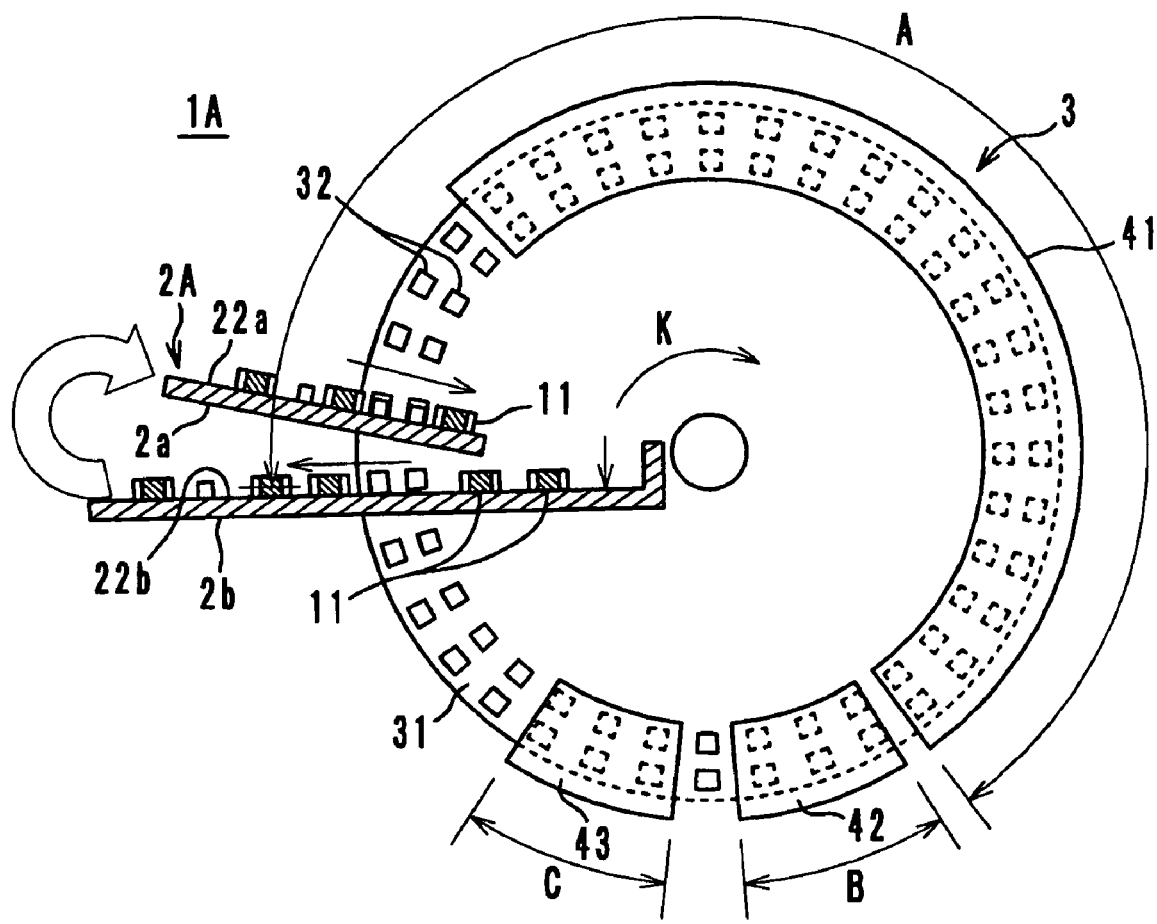
FIG. 6 is a schematic front view showing a second preferred embodiment of the handling device for electronic chip components according to the present invention.
Figure 7:
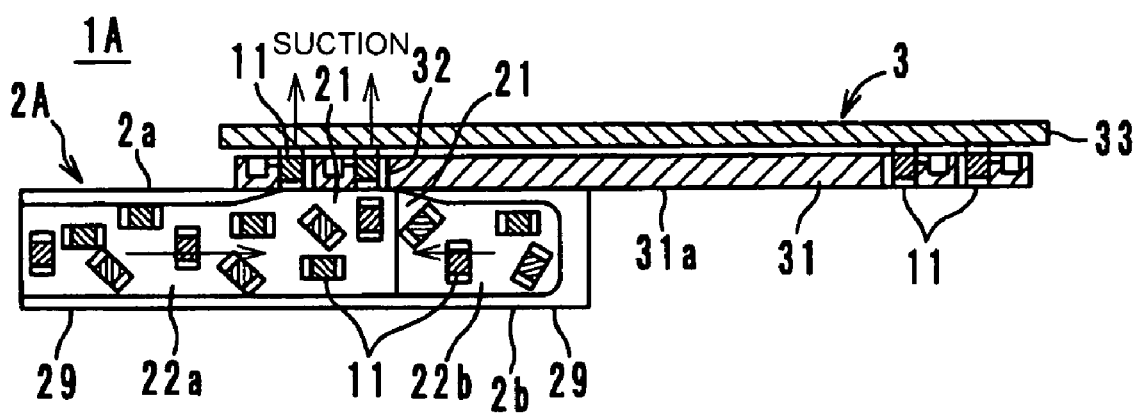
FIG. 7 is a horizontal sectional view of the handling device for electronic chip components shown in FIG. 6.

Second Preferred Embodiment, FIGS. 6 and 7

FIG. 6 is a front view of a handling device 1A for electronic chip components and FIG. 7 is a horizontal sectional view of the handling device 1A. The indexing table 3 is preferably the same as the one described in detail in the first preferred embodiment of the present invention.

A circulatory feeder 2A includes a first supply chute 2a and a second supply chute 2b which is set below the first supply chute 2a. The first supply chute 2a has a transport surface 22a with a descending inclination and the second supply chute 2b has a transport surface 22b which is substantially horizontally disposed.

A plurality of the chip components 11 put on the upper end side of the first supply chute 2a successively slides down onto the transport surface 22a by their own weight and the vibration of the first supply chute 2a in a fixed direction, and the plurality of chip components 11 is moved to one end of the second supply chute 2b from the lower end of the first supply chute 2a. The height difference in the drop at this time is small and defects such as cracks, chips, etc., are not likely to occur in the chip components 11. The plurality of chip components 11 moved to the second supply chute 2b is successively moved on the transport surface 22b to the other end of the second supply chute 2b when the second supply chute 2b is vibrated in a fixed direction. The chip components 11 which reach the other end of the second supply chute 2b are put on the upper end of the first supply chute 2a once again by a collecting device, which is not shown in the drawing. In this way, the plurality of chip components 11 is successively moved clockwise in the vertical direction.

Each of the supply chutes 2a and 2b has a side wall 29 at a fixed peripheral edge thereof so that the chip components 11 may not turn aside from the transport surfaces 22a and 22b. The side wall 29 has an opening portion 21, the width of which is larger than the added opening portions of the two cavities 32. The side wall 29 close to the opening portion 21 is tapered so that the chip components 11 may be easily put into the cavities 32.

In each of the supply chutes 2a and 2b, the chip components 11, which are screened based on only the orientation of the width direction (W direction) and the thickness direction (T direction), are supported on one side surface thereof and, while the orientation of the length direction (L direction) is not decided and is randomly oriented, the chip components 11 are transported. When the chip components 11 have a substantially square pillar shape with a substantially square transverse cross-section, as in the second preferred embodiment, it is not necessary to screen the chip components based on the orientation of the W direction and the T direction.

Out of the plurality of chip components 11 moving on the transport surface 22a of the first supply chute 2a, chip components 11 put in the negative-pressure suction area in the vicinity of cavities 32 of the indexing table 3 are directly put into the cavities 32 due to the negative pressure, without moving along the main surface 31a, and are positioned.

The chip components 11 which are not put into the cavities 32 are moved to the second supply chute 2b. Out of the chip components 11 moving along the transport surface 22b of the second supply chute 2b, the chip components 11 put in the negative-pressure area in the vicinity of the cavities 32 of the indexing table 3 are directly put into the cavities 32 due to the negative pressure, without moving on the main surface 31a, and are positioned.

The handling device 1A for electronic chip components having the above-described construction has the same effect as in the first preferred embodiment, and, since there are chances for the chip components 11 to be put into the cavities 32 once in each of the first supply chute 2a and the second supply chute 2b, the chip components 11 can be more easily put into the cavities.

Moreover, regarding the chip components 11 having the relationship of length L> width W> thickness T, the end surface may be in contact with the transport surfaces 22a and 22b (the chip components may stand) while being transported in the circulatory feeder 2A. Then, the standing chip components 11 are brought down by an obstacle such as a flow of compressed air, a scraper, etc., set at a fixed location in the transport route.

Figure 8:
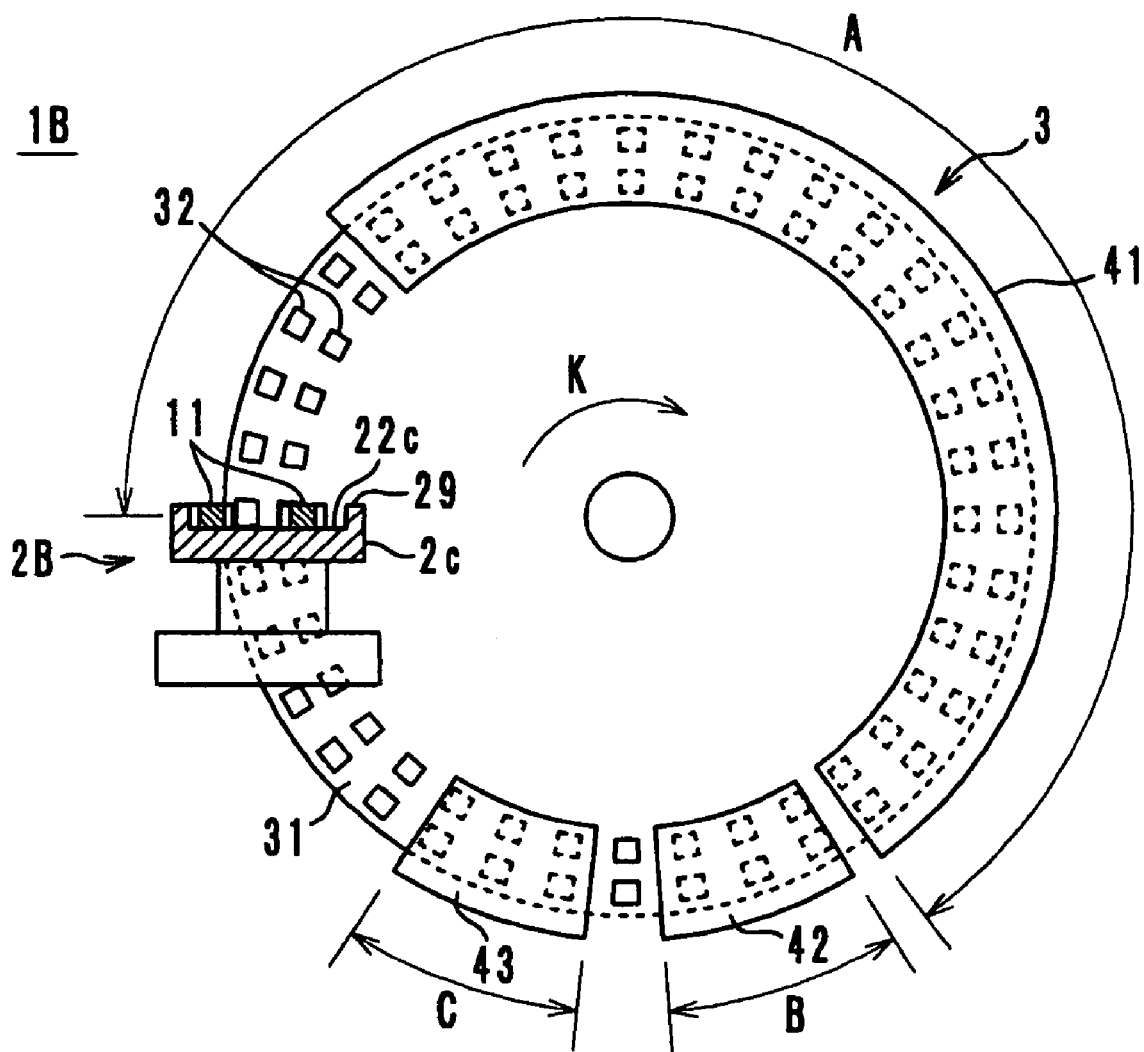
FIG. 8 is a schematic front view showing a third preferred embodiment of the handling device for electronic chip components according to the present invention.
Figure 9:
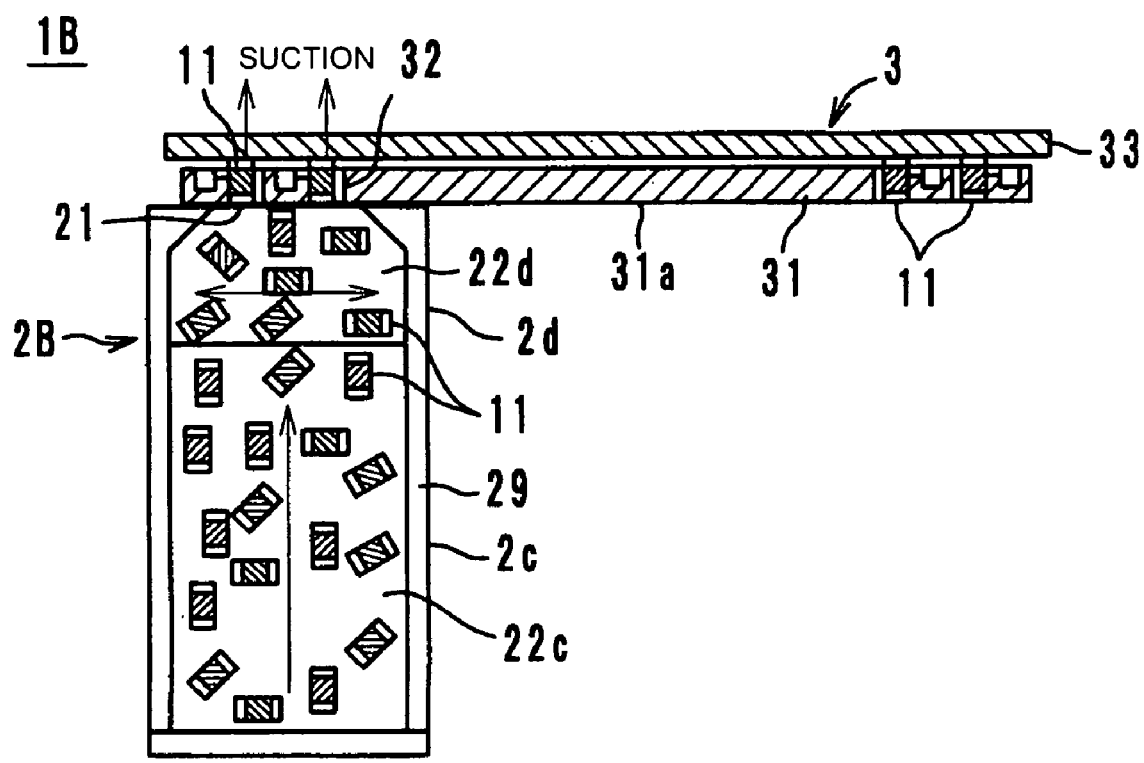
FIG. 9 is a horizontal sectional view of the handling device for electronic chip components shown in FIG. 8.

Third Preferred Embodiment, FIGS. 8 and 9

FIG. 8 is a front view of a handling device 1B for electronic chip components and FIG. 9 is a horizontal sectional view of the handling device 1B. The indexing table 3 is preferably the same as the one described in detail in the first preferred embodiment of the present invention.

In a feeder 2B, a first linear feeder 2c having a transport passage extending in the direction that is substantially perpendicular to the main surface 31a of the indexing table 3 and a second linear feeder 2d having a transport passage extending in the direction that is substantially parallel to the main surface 31a are integrally combined. The linear feeders 2c and 2d include transport surfaces having a large area in which a plurality of chip components is able to freely move and are substantially horizontally disposed.

A plurality of chip components 11 put on one end of the first linear feeder 2c is successively moved to the other end on the transport surface 22c when the first linear feeder 2c vibrates in a fixed direction, and the plurality of chip components 11 moves to the second linear feeder 2d. The plurality of chip components 11 moved to the second linear feeder 2d is moved back and forth substantially parallel to the main surface 31a of the indexing table 3 when the second linear feeder 2d is vibrated in a fixed direction. Although the first linear feeder 2c and the second feeder 2d are preferably combined as the feeder 2B according to the third preferred embodiment, the feeder 2B may be constructed by using only the first linear feeder 2c.

The feeder 2B includes the side wall 29 at the peripheral edge of the transport surfaces 22c and 22d. The side wall 29 has the opening portion 21, the width of which is larger than the total width of the opening portions of the two cavities 32. The side wall 29 which is close to the opening portion 21 is tapered so that the chip components 11 may be easily put into the cavities 32.

In the feeder 2B, the chip components 11, which are screened based on the orientation of the width direction (W direction) and the thickness direction (T direction), are supported on a side surface thereof and, while the orientation of the length direction (L direction) is not decided and is randomly oriented, the chip components 11 are transported. When the chip components 11 have a substantially square pillar shape, as in the present third preferred embodiment, it is not required to screen the chip components 11 based on the orientation of the W direction and the T direction.

The handling device 1B for electronic chip components having the above-described construction produces the same effect as in the first preferred embodiment of the present invention.

Figure 10:
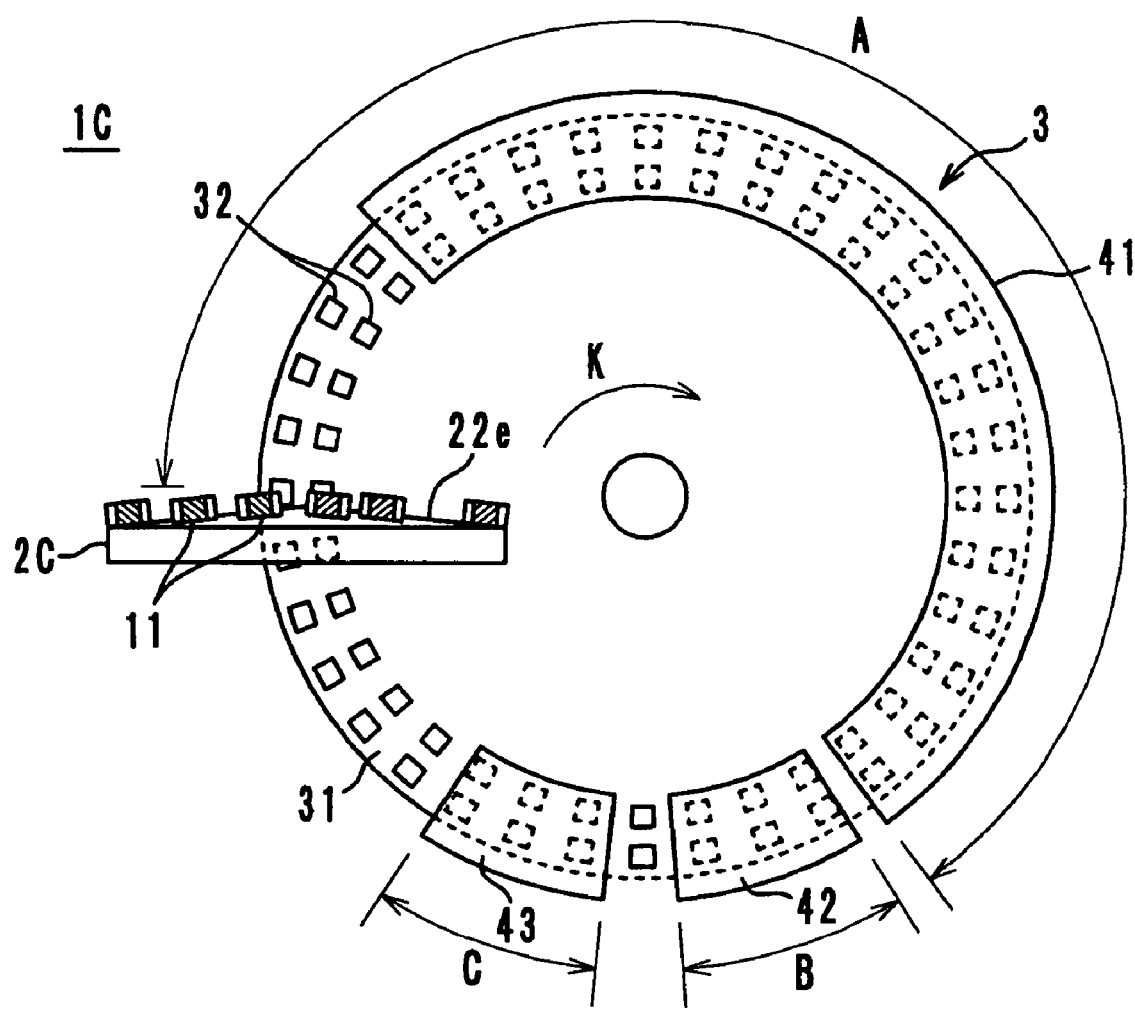
FIG. 10 is a schematic front view showing a fourth preferred embodiment of the handling device for electronic chip components according to the present invention.
Figure 11:
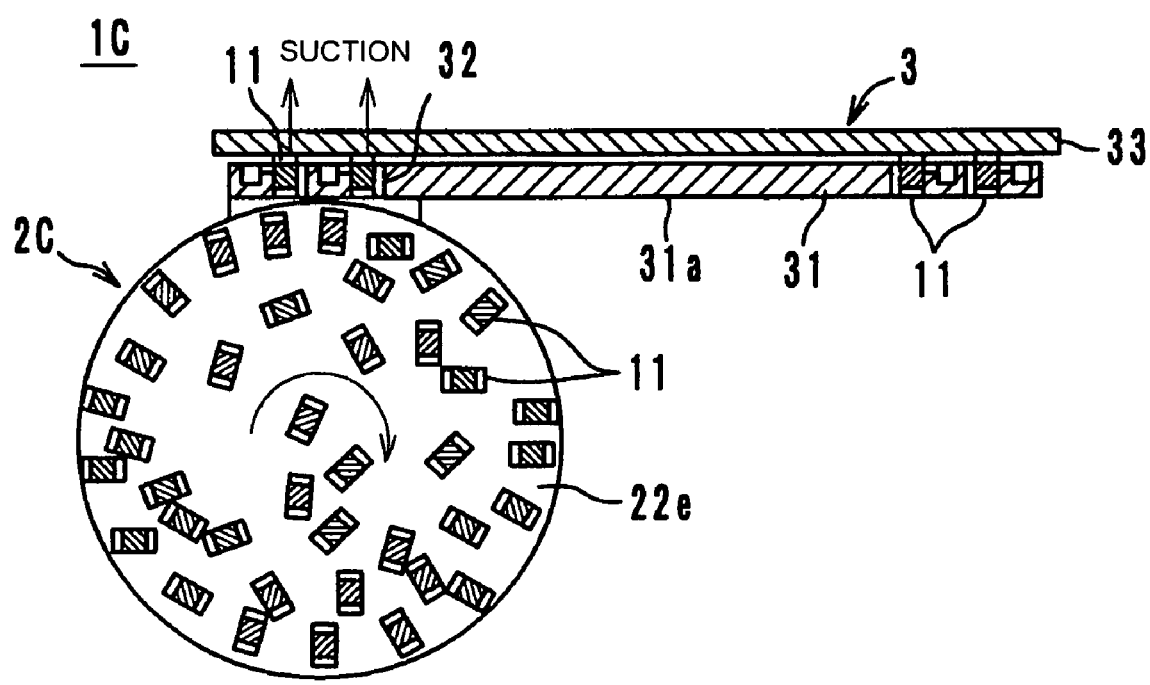
FIG. 11 is a horizontal sectional view of the handling device for electronic chip components shown in FIG. 10.

Fourth Preferred Embodiment, FIGS. 10 and 11

FIG. 10 is a front view of a handling device 1C for electronic chip components and FIG. 11 is a horizontal sectional view of the handling device 1C. The indexing table 3 is preferably the same as the one described in detail in the first preferred embodiment of the present invention.

A rotary table 2C defining a feeder turns clockwise. The upper surface of the rotary table 2C has a convex cone surface 22e in the middle. When a plurality of chip components 11 is successively placed in the middle of the rotary table 2C, the chip components 11 are made to slide down on the cone surface 22e and are compulsorily moved to the peripheral edge by the centrifugal force generated by the rotation of the rotary table 2C.

In the rotary table 2C, the chip components 11, which are screened based on the orientation of the width direction (W direction) and the thickness direction (T direction), are supported on a side surface thereof and, while the orientation of the length direction (L direction) is not decided and is randomly oriented, the chip components 11 are transported. When the chip components 11 have a substantially square pillar shape, as in the present fourth preferred embodiment, it is not required to screen the chip components 11 based on the orientation of the W direction and the T direction.

Out of the plurality of chip components 11 moved to the peripheral edge of the rotary table 2C, chip components 11 put in the negative-pressure suction area in the vicinity of cavities 32 of the indexing table 3 are directly put into the cavities 32 due to the negative pressure, without moving along the main surface 31a, and are positioned.

The chip components 11 which are not put into the cavities 32 drop into a collecting device (not illustrated) from the outer edge of the rotary table 2C and are put in the middle of the rotary table 2C once again. In this way, the process is repeated until the chip components 11 are put into the cavities 32.

The handling device 1C for electronic chip components having the above-described construction produces the same effect as in the first preferred embodiment of the present invention.

Figure 12:
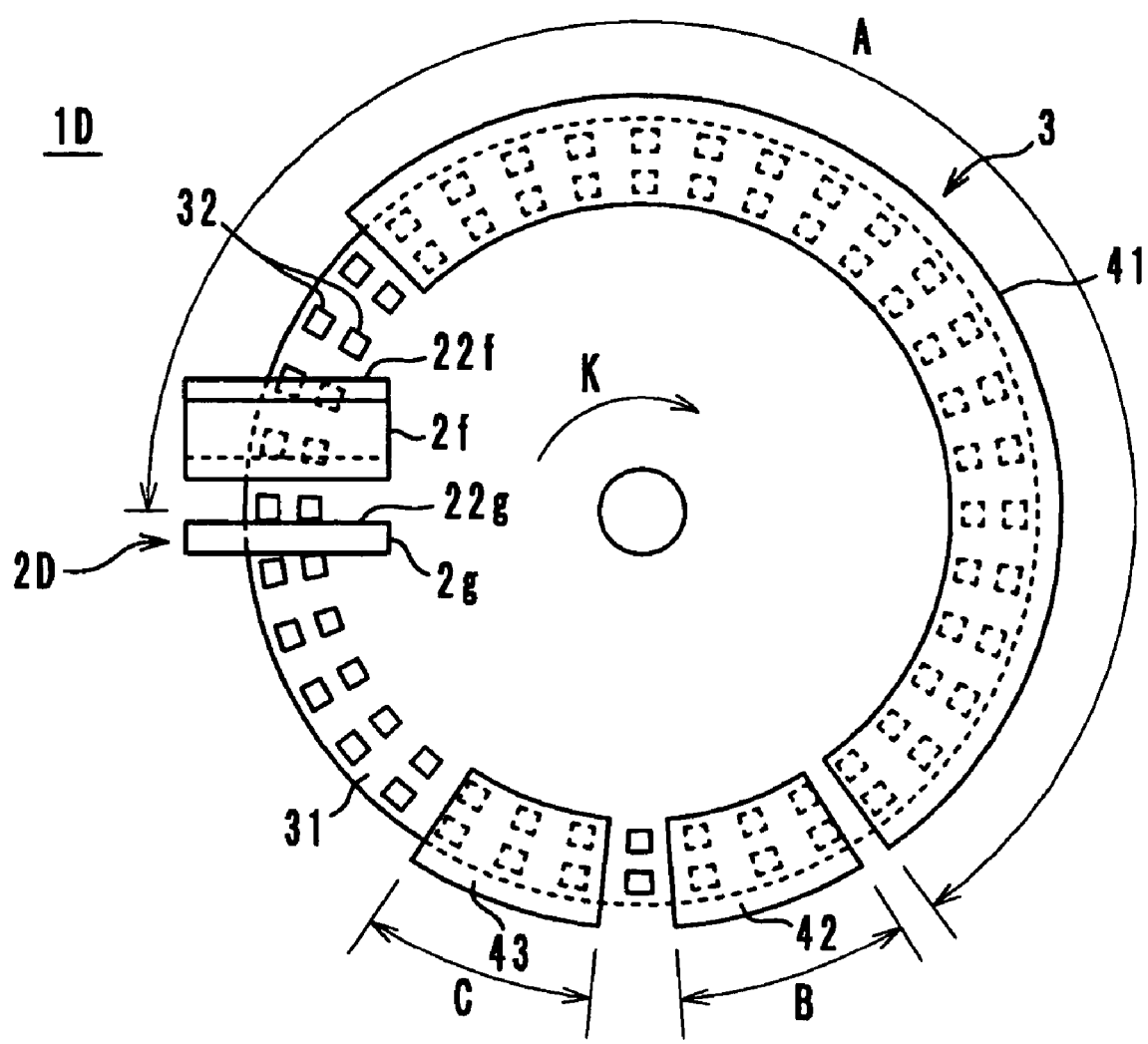
FIG. 12 is a schematic front view showing a fifth preferred embodiment of the handling device for electronic chip components according to the present invention.
Figure 13:
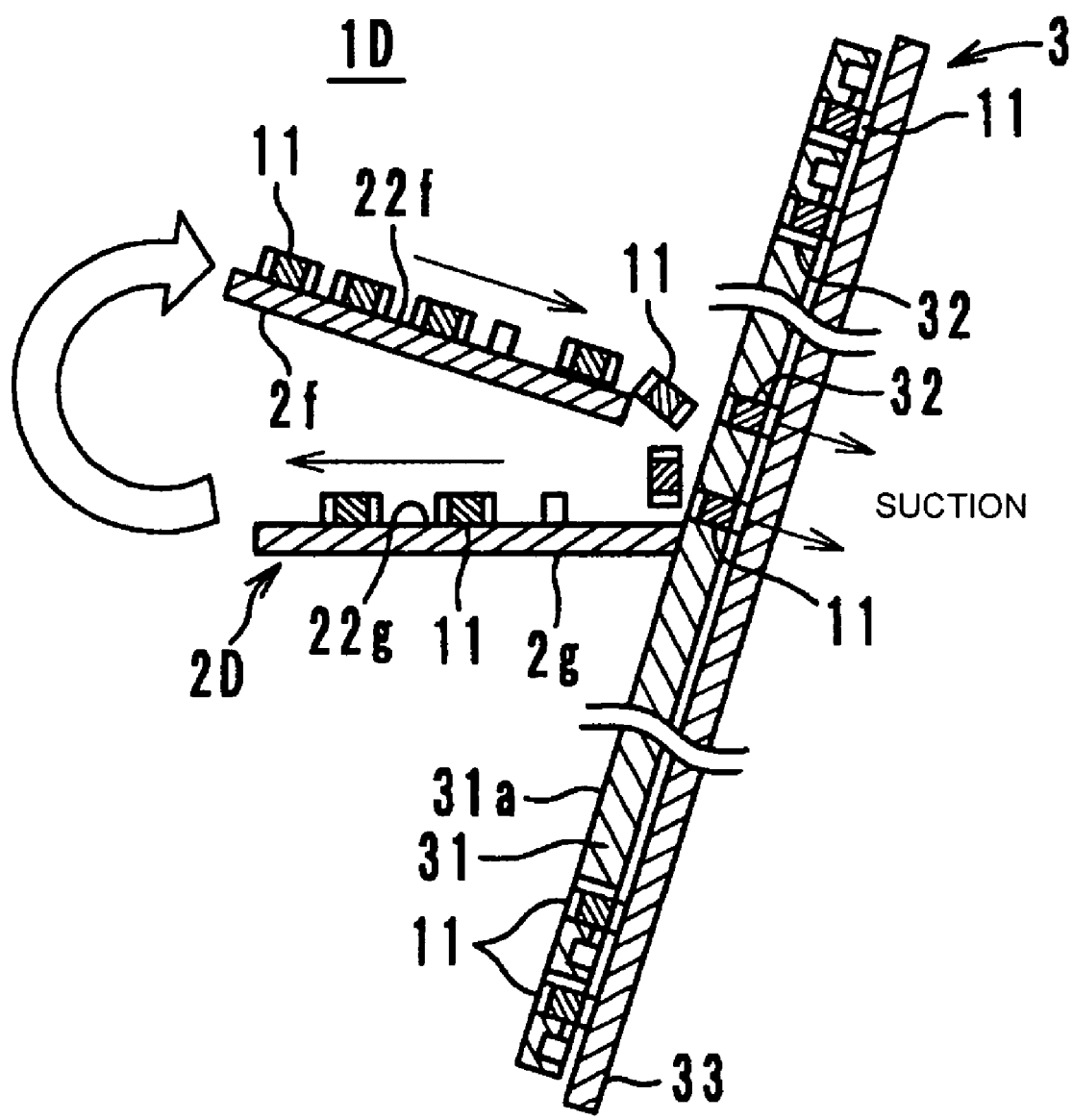
FIG. 13 is a vertical sectional view of the handling device for electronic chip components shown in FIG. 12.

Fifth Preferred Embodiment, FIGS. 12 and 13

FIG. 12 is a front view of a handling device 1D for electronic chip components and FIG. 13 is a vertical sectional view of the handling device 1D. The indexing table 3 is preferably constructed in the same way as described in detail in the first preferred embodiment. However, in the present fifth preferred embodiment, the indexing table 3 is disposed such that the main surface 31a of the indexing table 3 is largely inclined and such that the angle between the main surface 31a and the transport surface of a circulatory feeder 2D increases.

The circulatory feeder 2D includes a first supply chute 2f and a second supply chute 2g which is set below the first supply chute 2f. The first supply chute 2f has a transport surface 22f of a descending inclination and the second supply chute 2g has a transport surface which is substantially horizontally disposed.

A plurality of chip components 11, which is put on the upper end of the first supply chute 2f, successively slides down onto the transport surface 22f by their own weight and the vibration of the first supply chute 2f in a fixed direction, and the plurality of chip components 11 is moved to one end of the second supply chute 2g from the lower end of the first supply chute 2f. The height difference in the drop at this time is small and defects such as cracks, chips, etc., are prevented from occurring in the chip components 11. The plurality of chip components 11 moved to the second supply chute 2g is successively moved on the transport surface 22g to the other end of the second supply chute 2g when the second supply chute 2g is vibrated in a fixed direction. The chip components 11 that reach the other end of the second supply chute 2g are put on the upper end of the first supply chute 2f once again by a collecting device, which is not shown in the drawing. In this way, the plurality of chip components 11 is successively moved clockwise in the vertical direction.

In each of the supply chutes 2f and 2g, the chip components 11, which are screened based on the orientation of the width direction (W direction) and the thickness direction (T direction), are supported on a side surface thereof and, while the orientation of the length direction (L direction) is not decided and is randomly oriented, the chip components 11 are transported. When the chip components 11 have a substantially square pillar shape as in the present fifth preferred embodiment, it is not required to screen the chip components 11 based on the orientation of the W direction and the T direction.

Out of the plurality of chip components 11 sliding down on the transport surface 22f of the first supply chute 2f and jumping out from the lower-end portion into the air, chip components 11 put in the negative-pressure suction area in the vicinity of cavities 32 of the indexing table 3 are directly put into the cavities 32 in the air due to the negative pressure, without moving on the main surface 31a, and are positioned.

The chip components 11 which are not put into the cavities 32 are moved to the second supply chute 2g. Out of the plurality of chip components 11 moved to the second supply chute 2g, the chip components 11 put in the negative-pressure suction area in the vicinity of cavities of the indexing table 3 are directly put into the cavities 32 because of the negative pressure, without moving on the main surface 31a, and are positioned.

The handling device ID for electronic chip components having the above-described construction produces the same effect as in the first preferred embodiment, and, since there are chances for the chip components 11 to be put into cavities 32 once in the air and once in the second supply chute 2g, the chip components 11 can be more surely put into the cavities 32.

Figure 14:
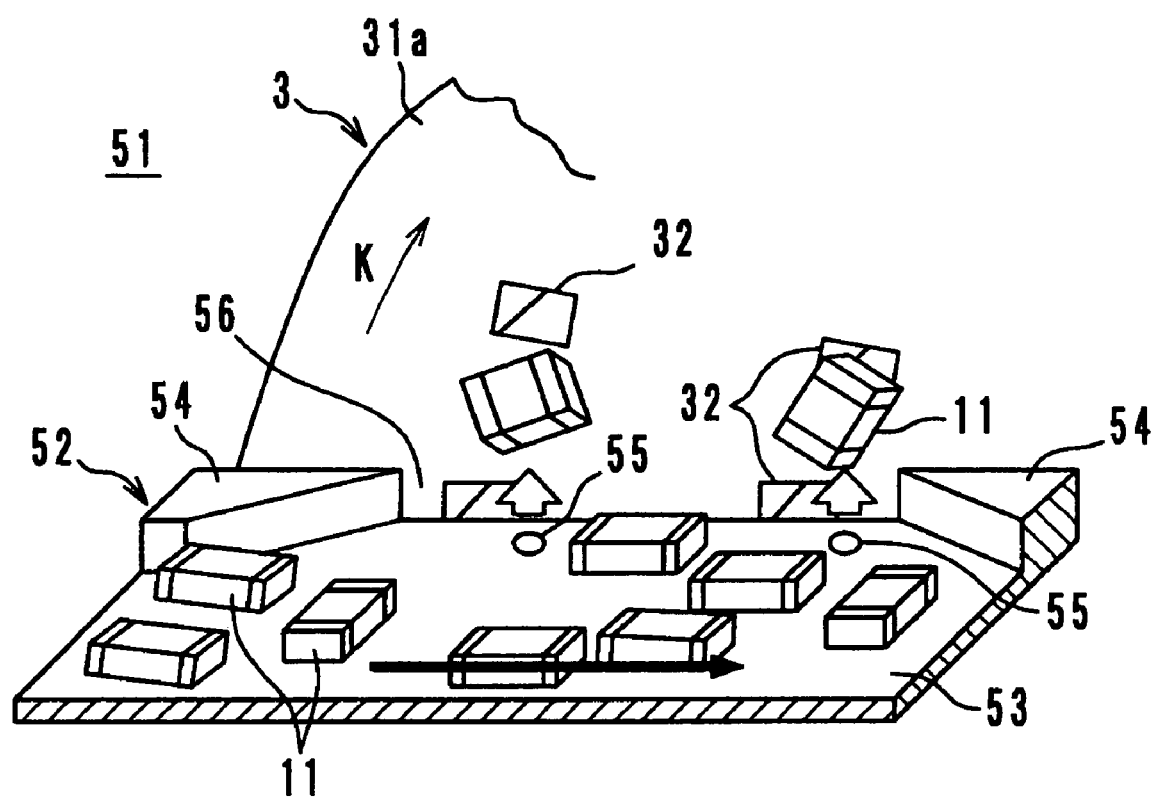
FIG. 14 is a partially expanded perspective view showing a sixth preferred embodiment of the handling device for electronic chip components according to the present invention.

Sixth Preferred Embodiment, FIG. 14

FIG. 14 is a partially expanded perspective view of a handling device 51 for electronic chip components. The indexing table 3 is preferably constructed in the same way as described in detail in the first preferred embodiment. However, in the present sixth preferred embodiment, the indexing table 3 is disposed such that the main surface 31a of the indexing table 3 is largely inclined and that the angle between the main surface 31a and the transport surface of a feeder 52 increases.

The feeder 52 includes a transport surface 53 having a large area, in which a plurality of chip components 11 is able to freely move, and is substantially horizontally disposed. When the feeder 52 is vibrated in a fixed direction, the plurality of chip components which is put on the transport surface 53 is successively moved in the direction of an arrow shown in FIG. 14.

The feeder 52 includes an opening portion 56 the width of which is larger than the total width of the opening portions of the two cavities 32. Compressed-air holes 55 for making the chip components 11 float in air are provided in the opening portion 56. In the present sixth preferred embodiment, the two compressed-air holes 55, the diameter of which is relatively large, are preferably used, but instead of the holes 55, a porous plate may be used. The side wall 54 in the vicinity of the opening portion 21 is tapered so that it may become easier to collect the chip components 11 in the vicinity of the cavities 32.

The chip components 11 are successively moved by the feeder 52 and supplied to the opening portion 56 of the feeder 52. At this time, it is not required to perfectly align the chip components 11. The plurality of chip components 11 is made to float to the cavities 32, which are positioned a few cavities above the chip components 11 on the transport surface of the feeder 52, by the compressed air released from the compressed-air holes 55, and some of the chip components 11 in the negative-pressure suction area in the vicinity of cavities 32 are put directly into the cavities 32 in the air, without moving on the main surface 31a, because of the negative pressure. Since the position of the chip components 11 freely changes in the air, the occurrence of insertion failure of the chip components 11 into the cavities 32 is reduced.

In the present sixth preferred embodiment in particular, since the dimensions in length and width of the opening portion of the cavities 32 are set in accordance with the shape (length L> width W>thickness T) of the chip components 11, the opening portion of the cavities 32 is substantially rectangular. Accordingly, although it is required to screen the chip components 11 based on the orientation of the width direction (W direction) and the thickness direction (T direction) of the chip components 11 in the related handling device, in the case of the present sixth preferred embodiment, since the position of the chip components 11 changes freely, it is not required to screen the chip components 11 based on the orientation of the W direction and the T direction.

Moreover, a portion of the chip components 11 moves to the main surface 31a of the indexing table 3 and moves on the main surface 31a, and the chip components 11 which are put into the negative-pressure suction area in the vicinity of cavities 32 are put into the cavities 32 because of the negative pressure.

In this way, since there are a number of chances for the chip components 11 to be put into the cavities 32 in the air and on the main surface 31a of the indexing table 3, the chip components can be more reliably put into the cavities 32.

After the rest of the chip components 11 have slid on the main surface 31a of the indexing table 3, they move to the feeder 52 and are made to float by the compressed air once again.

Moreover, during such transportation of the chip components 11, there are cases where the end surfaces of the chip components 11 come into contact with the transport surface 53a (that is, the chip components 11 stand). Then, an obstacle such as a compressed air flow, a scraper, etc., is set at a fixed location of the feeder 52 and the standing chip components 11 are brought down (the side of the chip components 11 is made to contact the transport surface 53a).

Furthermore, when the indexing table 3 is disposed so as to be substantially vertical (for example, the indexing table 3 is inclined at about three degrees from upright), the chip components 11 are always directly put into the cavities 32 in the air without moving along the main surface 31a and positioned.

Figure 15:
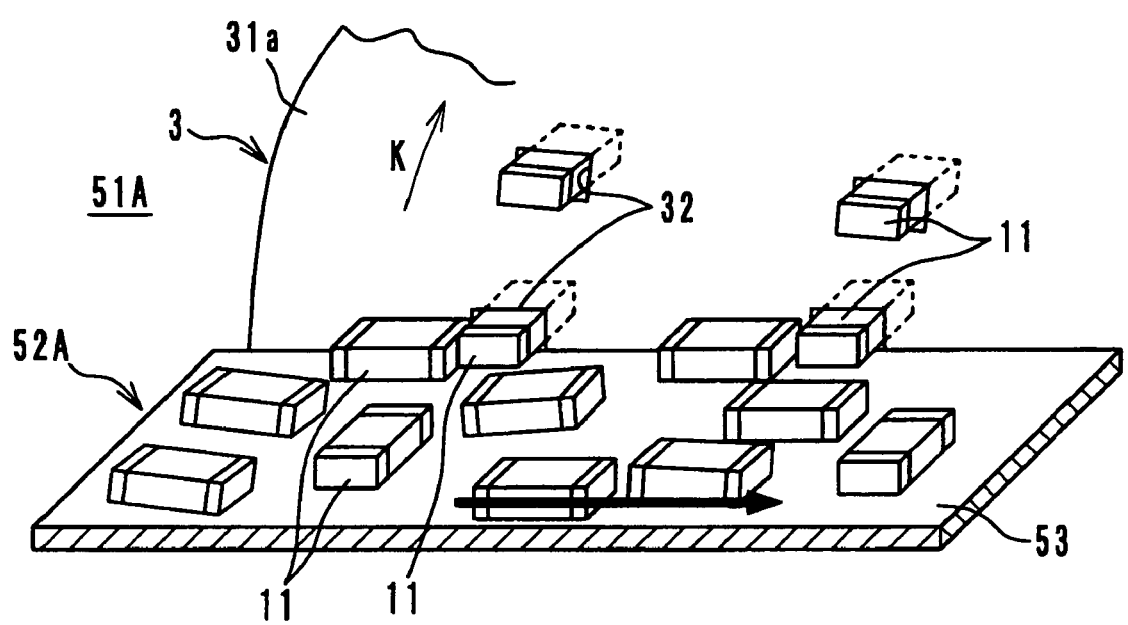
FIG. 15 is a partially expanded perspective view showing a seventh preferred embodiment of the handling device for electronic chip components according to the present invention.
Figure 16:
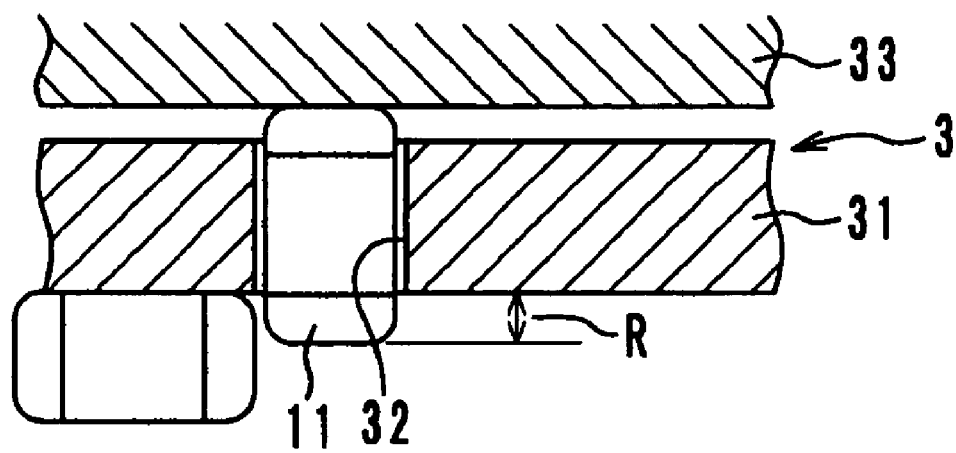
FIG. 16 is a partially expanded horizontal sectional view of the handling device for electronic chip components shown in FIG. 15.

Seventh Preferred Embodiment, FIGS. 15 and 16

FIG. 15 is a partially expanded perspective view of a handling device 51A for electronic chip components. The indexing table 3 is preferably constructed in the same way as described in detail in the first preferred embodiment. In the present seventh preferred embodiment, the indexing table is disposed so as to be substantially vertical (for example, the indexing table 3 is inclined at about three degrees from upright). The indexing table 3 intermittently rotates clockwise.

A feeder 52A includes the transport surface 53 having a large area where a plurality of chip components 11 can be freely moved and is substantially horizontally disposed. When the feeder 52A is vibrated in a fixed direction, the plurality of chip components 11 put on the transport surface 53 is successively moved in the direction of the arrow in FIG. 15.

The chip components 11 are successively moved by the feeder 52A and the chip components 11 continuously supplied to the vicinity of cavities 32 of the indexing table 3. The chip components 11 are directly put into the cavities 32 from the feeder 52A without moving on the main surface 31*a* because of the negative pressure generated in the vicinity of the cavities 32.

As shown in FIG. 16, the cavity 32 has a depth dimension such that the end portion of a chip component 11 put into the cavity 32 protrudes in the transport passage of the feeder 52A by a fixed amount R (for example, about 1 mm to about 2 mm). Accordingly, the chip components 11 moving on the feeder 52A are caught by the end portion of the chip component 11 put into the cavity 32. A chip component 11 which is caught will be in a waiting state in order to be put into the cavity 32 next, and, as soon as a next cavity 32 comes, the chip component in a waiting state is put into the cavity 32 without delay. As a result, the rate of chip components 11 being put into the cavities 32 can be improved.

Furthermore, since the end portion of the chip components 11 is protruded from the main surface 31*a* of the indexing table 3, the measurement of electrical characteristics can be easily made in a later process.

Figure 17:
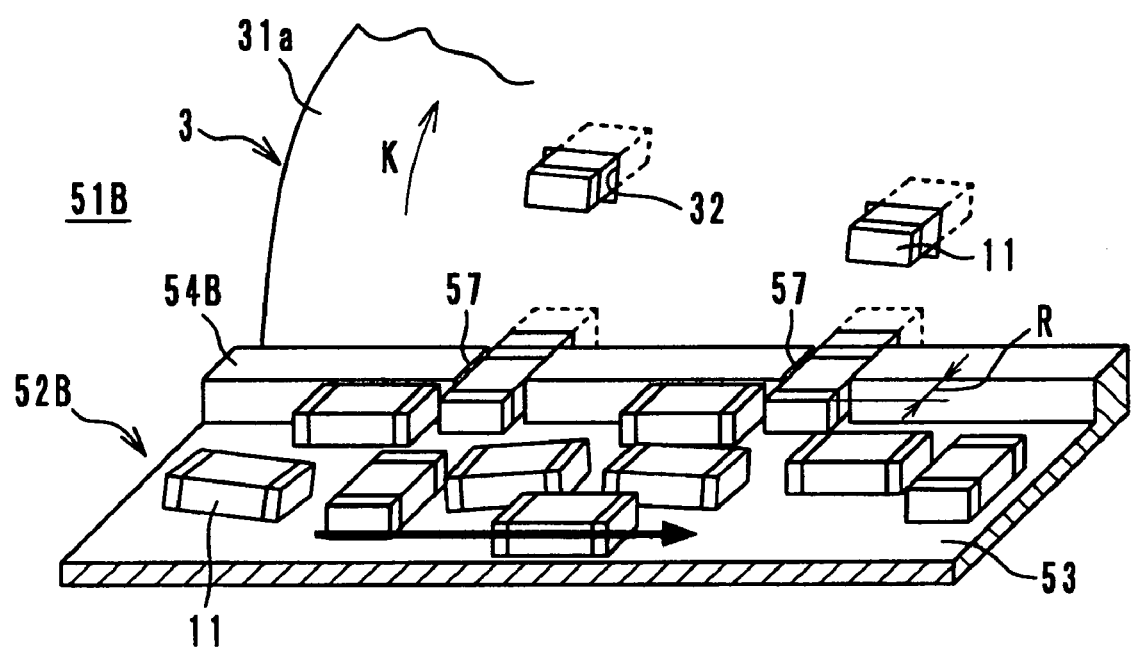
FIG. 17 is a partially expanded perspective view showing an eighth preferred embodiment of the handling device for electronic chip components according to the present invention.
Figure 18:
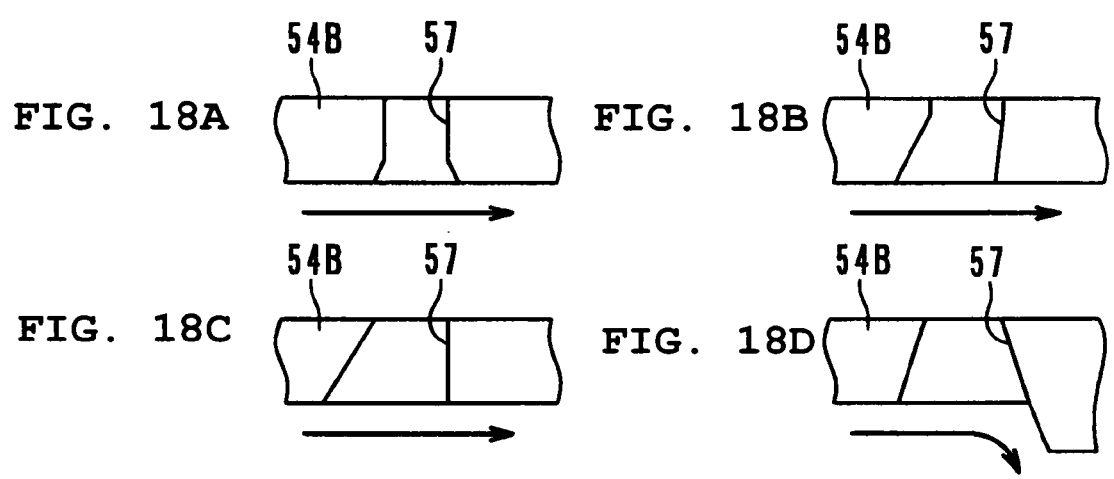
FIG. 18 is a partial top view of the handling device for electronic chip components shown in FIG. 17.

Eighth Preferred Embodiment, FIGS. 17 and 18

FIG. 17 is a partially expanded perspective view of a handling device 51B for electronic chip components. The indexing table 3 is preferably constructed in the same way as described in detail in the seventh preferred embodiment. A feeder 52B includes a side wall 54B at the peripheral edge of the transport surface 53 so that the chip components 11 may not turn aside from the transport surface 53. The side wall 54B includes two opening portions 57, the width of which is slightly larger then the width of the opening portion of the cavity, in the portions which come close to the cavities 32 of the indexing table 3.

The chip components 11, which are to be put into the cavities 32 next, are in a waiting state in the opening portions 57. The thickness of the side wall 54B is set such that the end portion of the chip components 11 in a waiting state is protruded in the transport passage of the feeder 52B by a fixed amount R. Accordingly, the chip components 11 moving on the feeder 52B are caught by the end portion of the chip components 11 in a waiting state. The chip components 11 which are caught become the next chip components 11 in a waiting state. As a result, since chip components in a waiting state are almost always secured, the rate of the chip components 11 being put into the cavities 32 can be improved.

Moreover, the entrance portion of the opening portion 57 may be tapered as shown in FIG. 18A so that the chip components 11 may be easily put into the cavities 32. As shown in FIGS. 18B and 18C, the entrance portion of the opening 57 may be largely tapered on the upstream side in the transportation direction of the feeder 52B. As shown in FIG. 19D, also a bank may be provided on the downstream side in the transportation direction of the feeder 52B.

Figure 19:
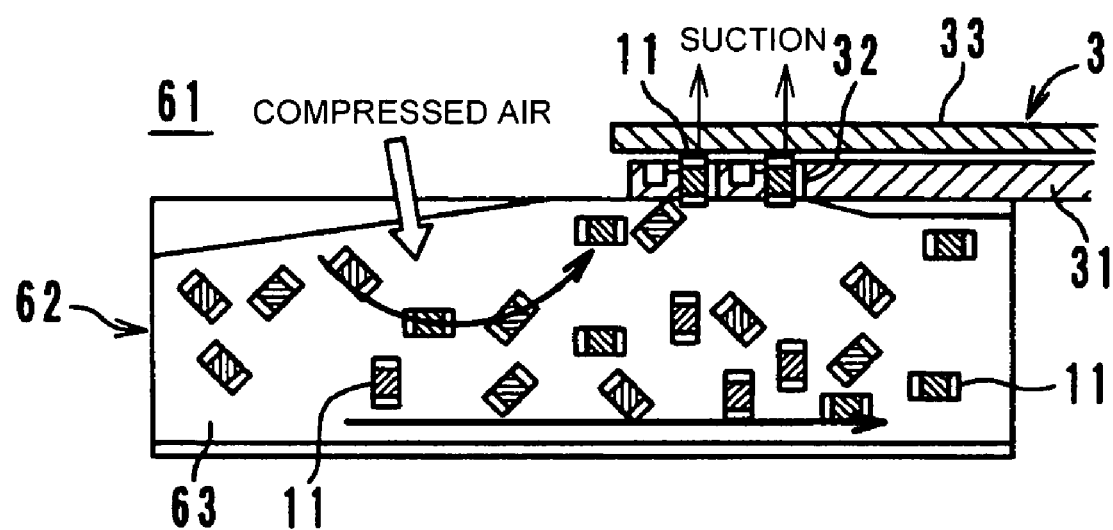
FIG. 19 is a partially expanded horizontal sectional view showing a ninth preferred embodiment of the handling device for electronic chip components according to the present invention.
Figure 20:
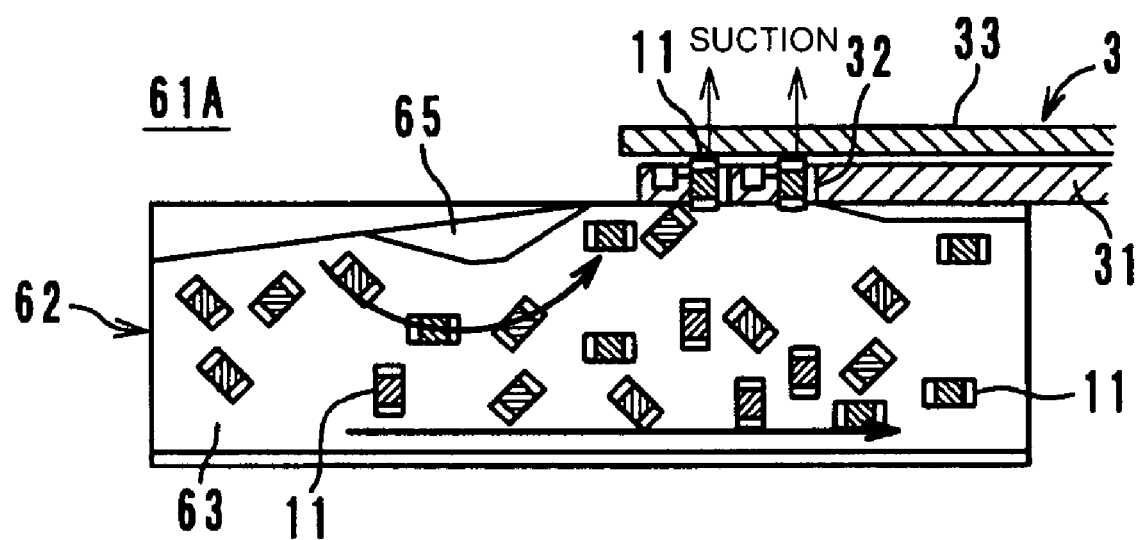
FIG. 20 is a partially expanded horizontal sectional view showing a modified example of the handling device for electronic chip components shown in FIG. 19.

Ninth Preferred Embodiment, FIGS. 19 and 20

FIG. 19 is a partially expanded horizontal sectional view of a handling device 61 for electronic chip components. The indexing table 3 is preferably constructed in the same way as in the first preferred embodiment of the present invention.

A feeder 62 includes a transport surface 63 having a large area where a plurality of chip components 11 is able to freely move and is substantially horizontally disposed. In order that the supply density of chip components 11 transported to the vicinity of cavities 32 of the indexing table 3 may be made a target value, the excessively dense chip components 11 being transported are dispersed and, in this way, the occurrence of failure to put the chip components 11 into the cavities 32 can be reduced.

FIG. 20 is a partially expanded horizontal sectional view showing a handling device 61A for electronic chip components in which the supply density of chip components 11 is adjusted to a target value by an obstacle 65 instead of using compressed air.

Figure 21:
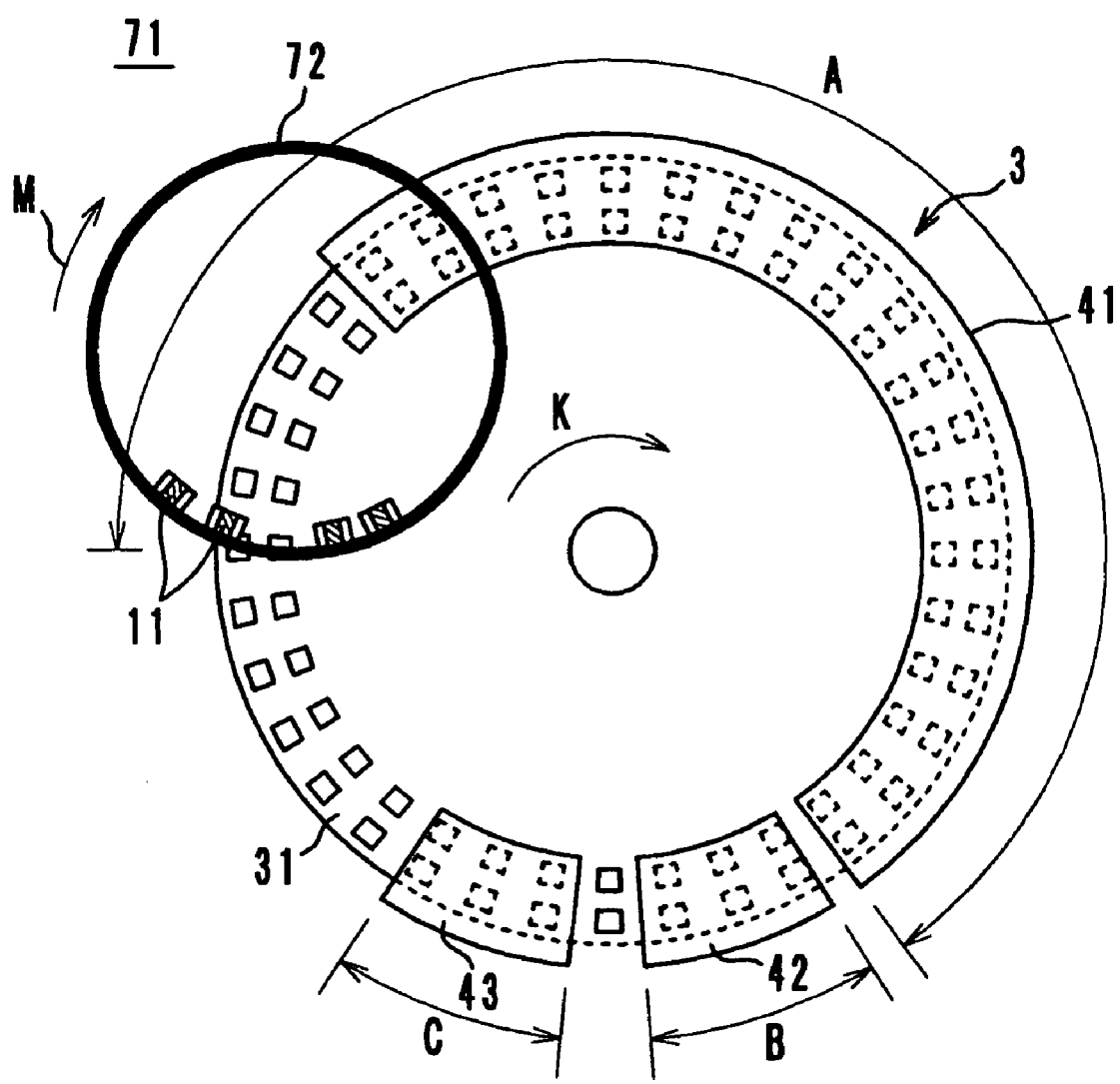
FIG. 21 is a schematic front view showing a tenth preferred embodiment of the handling device for electronic chip components according to the present invention.

Tenth Preferred Embodiment, FIG. 21

As shown in FIG. 21, a handling device 71 for electronic chip components according to a tenth preferred embodiment is preferably the same as the handling device 1 of the first preferred embodiment, except for a circulatory feeder 72.

The circulatory feeder 72 is preferably of an endless-belt-type and rotates clockwise (in the direction of arrow M). A plurality of chip components 11 placed on the inner peripheral surface of the circulatory feeder 72 is compulsorily moved in accordance with the rotation of the circulatory feeder 72. However, when the plurality of chip components 11 reaches a certain height, the chip components 11 roll down by their own weight and are placed on the inner peripheral surface of the circulatory feeder 72 once again. This operation is repeated until the chip components 11 are put into the cavities 32 by the negative pressure generated in the vicinity of cavities 32 of the indexing table 3.

In the handling device 71 for electronic chip components having the above-described construction, since the distance for dropping of the chip components by their own weight is short, the mechanical shock applied to chip-type laminated capacitors 11 is small and defects such as cracks, chips, etc., are prevented from occurring. Furthermore, since the circulatory feeder 72 is made of an elastic material, damage to the chip components is small.

Figure 22:
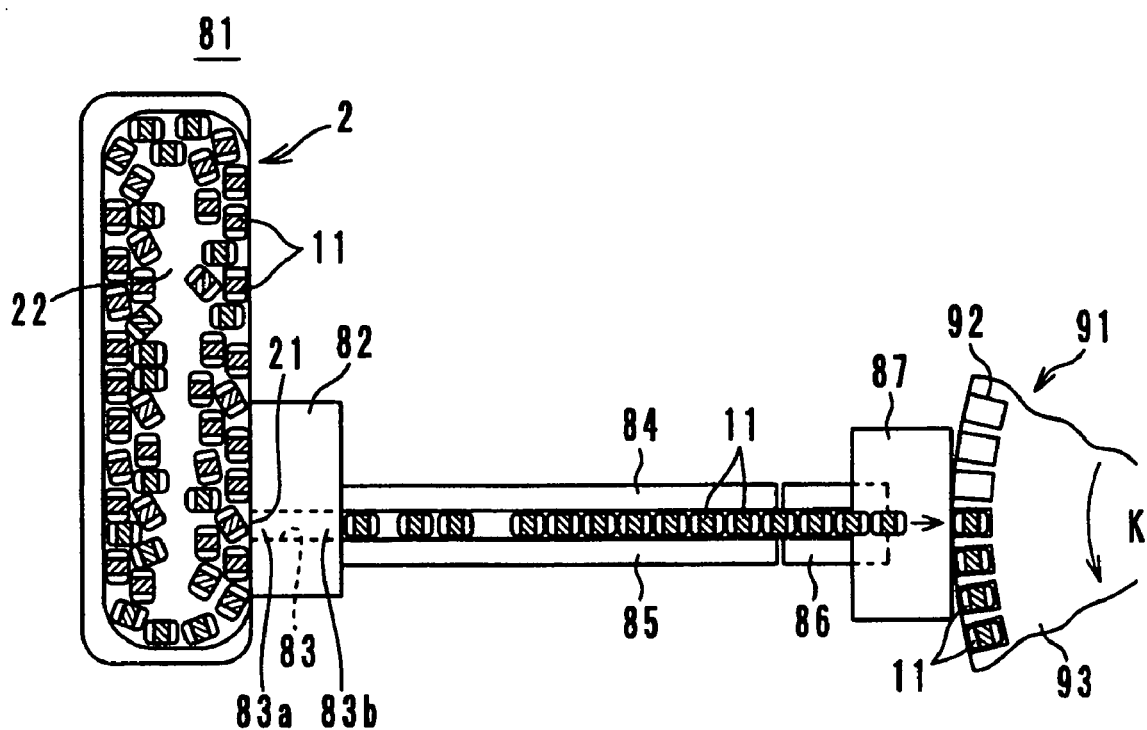
FIG. 22 is a top view showing an eleventh preferred embodiment of the handling device for electronic chip components according to the present invention.
Figure 23:
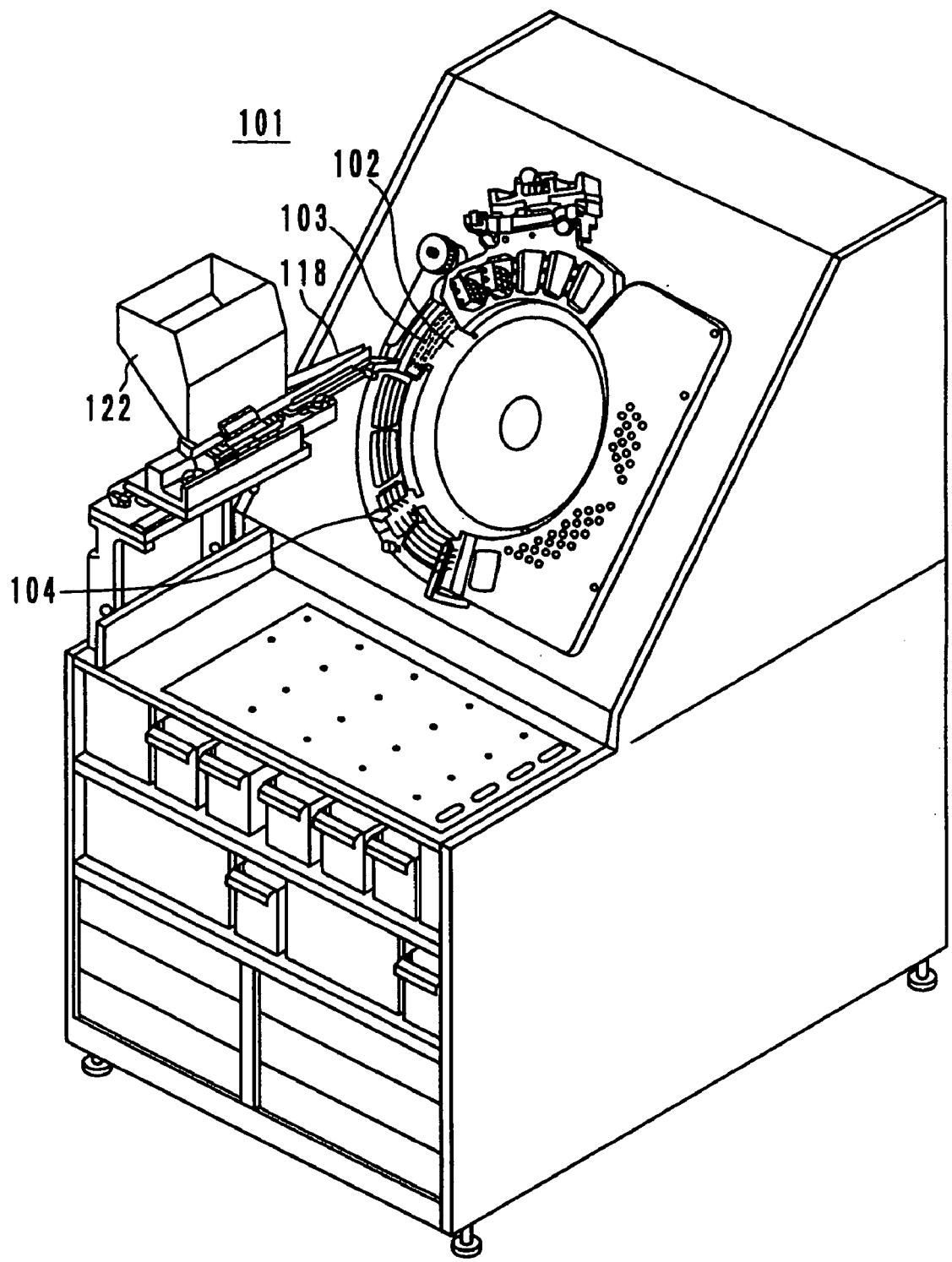
FIG. 23 is a perspective view showing a related handling device for electronic chip components.

Eleventh Preferred Embodiment, FIG. 22

FIG. 22 is a top view showing a handling device 81 for electronic chip components according to an eleventh preferred embodiment. The handling device 81 includes a circulatory feeder 2, a suction block 82, a linear feeder 84 (transport portion), a one-part-separating block 87, and an indexing table 91 (accommodating device).

When the circulatory feeder 2 is vibrated in a fixed direction, a plurality of chip components 11 put on the transport surface is successively moved clockwise. The circulatory feeder 2 includes an opening portion 21 in a portion that is adjacent to the suction block 82.

Inside the suction block 82, a hollow transport passage 83 for transporting the chip components 11 is formed. The entrance 83*a* is linked to the opening portion 21 of the circulatory feeder 2 and the exit 83*b* is connected to a pressure reducing device (not illustrated). The reduced pressure generated by the pressure reducing device produces a negative pressure for sending the chip components 11 to the entrance from the circulatory feeder 2 in the vicinity of the entrance 83*a*. Because of the negative pressure, the chip components 11 in the vicinity of the entrance 83*a* are directly put into the transport passage 83 and transported inside the transport passage 83.

The linear feeder 84 is connected to the exit 83*b* of the transport passage 83. The linear feeder 84 includes a vibrating line feeder 85 for transporting the chip components 11 while causing the chip components 11 discharged from the suction block 82 to be aligned in a fixed position, and a non-vibrating feeder discharge portion 86. The chip components 11 supplied from the line feeder 85 are sent to the feeder discharge portion 86.

A one-part-separating block 87 is provided to separate the chip components 11 transported from the linear feeder 84 in order to put the chip components 11 into cavities 92 of the indexing table 91. Inside the one-part-separating block 87, a hollow transport passage (not illustrated) for transporting the chip components 11 is formed. Although the chip components 11 supplied to the transport passage proceed to the cavities 92 by the suction from a reduced pressure source provided in a rotor 93 of the indexing table 91, it is possible to put the chip components 11 into the cavities 92 one-by-one by pressing down the chip components 11 in the rear in the transport passage using a pin, etc.

The indexing table 91 is rotated in the direction of arrow K and, in accordance with the rotation, the chip components 11 discharged from the separating-one-part block 87 are individually put into the cavities 92 and transported in the peripheral direction. The measurement and screening of the chip components 11 in the indexing table 91 which follow next are the same as in the first preferred embodiment of the present invention.

Moreover, the handling devices for electronic chip components according to the present invention are not limited to the above-described preferred embodiments and it is to be understood that changes and variations may be made without departing from the spirit and scope of the invention. For example, the accommodating device for chip components is not required to be vertically disposed and may be horizontally disposed or may be disposed at a tilted angle from the horizontal direction. Furthermore, while the chip components are transported in the accommodating device, processing steps such as marking, visual inspection, etc., may be performed.

Furthermore, the opening portion 21 included in the circulatory feeder 2 may be divided in accordance with the number of cavities coming close thereto and also may be formed so as to have substantially the same width as that of the cavity 32.

Regarding the cavities in the indexing table, although two cavities are disposed in the vicinity of the feeder in the first preferred embodiment, one cavity may be disposed. That is, an indexing table in which a plurality of cavities is included in one circle may be used. It goes without saying that an indexing table in which a plurality of cavities is included in a plurality of circles (three or more) may be used.

While the present invention has been described with respect to preferred embodiments, it will be apparent to those skilled in the art that the disclosed invention may be modified in numerous ways and may assume many embodiments other than those specifically set out and described above. Accordingly, it is intended by the appended claims to cover all modifications of the invention which fall within the true spirit and scope of the invention.

What is claimed is:

1. A handling device for electronic chip components, comprising:
   an accommodating device having a plurality of cavities arranged to put electronic chip components thereinto; and
   a feeder arranged to supply the electronic chip components to the accommodating device; wherein
   the feeder includes a transport surface arranged to transport the electronic chip components towards the plurality of cavities, and a feeding section arranged to feed the electronic components into the plurality of cavities;
   the accommodating device is arranged to move such that at least one of the cavities is successively disposed at a location which is in close proximity to the feeding section of the feeder;
   on the transport surface of the feeder, the electronic chip components are supported on only one side surface thereof, without fixing an orientation of a length direction of the electronic chip components;
   the electronic chip components are put directly into the cavities from the feeding section of the feeder by providing suction in the cavities from a cavity side;
   the feeder includes a sidewall at a peripheral edge of the transport surface;
   the sidewall includes an opening portion; and
   the opening portion in the sidewall is blocked by a cavity formation surface in which the cavities of the accommodating device are provided.

2. A handling device for electronic chip components as claimed in claim 1, wherein the feeder is a circulatory feeder in which the electronic chip components can be moved freely with any orientation thereof and the electronic chip components can be put into the cavities in a free order.

3. A handling device for electronic chip components as claimed in claim 1, wherein, when the electronic chip components are put into the cavities from the feeder, the electronic chip components are directly put into the cavities without being moved along a main surface of the accommodating device.

4. A handling device for electronic chip components as claimed in claim 1, wherein the accommodating device is a rotating disk-shaped device having a main surface, and the cavities are disposed so as to be located close to the feeder as a result of rotation thereof.

5. A handling device for electronic chip components as claimed in claim 4, wherein the accommodating device is disposed so that its rotation axis is in a substantially horizontal position.

6. A handling device for electronic chip components as claimed in claim 4, wherein the transport surface of the feeder has a descending inclination relative to the accommodating device and the main surface of the accommodating device is inclined such that an angle between the main surface of the accommodating device and the transport surface of the feeder increases.

7. A handling device for electronic chip components as claimed in claim 4, wherein the main surface of the accommodating device is inclined such that an angle between the main surface of the accommodating device and the transport surface of the feeder increases.

8. A handling device for electronic chip components as claimed in claim 4, wherein end portions of the electronic chip components put or waiting to be put into the cavities of the accommodating device protrude to the transport surface of the feeder.

9. A handling device for electronic chip components as claimed in claim 1, further comprising an obstacle arranged to limit a density of electronic chip components near the cavities of the accommodating device to a predetermined value.

10. A handling device for electronic chip components as claimed in claim 1, wherein electrical characteristics of the electronic chip components put into the cavities are measured.

11. A handling device for electronic chip components, comprising:
an accommodating device having a plurality of cavities arranged to put electronic chip components thereinto; and
a feeder arranged to supply the electronic chip components to the accommodating device; wherein
the feeder includes a transport surface arranged to transport the electronic chip components towards the plurality of cavities, and a feeding section arranged to feed the electronic components into the plurality of cavities;
the accommodating device is arranged to move such that at least one of the cavities is successively disposed at a location which is in close proximity to the feeding section of the feeder;
on the transport surface of the feeder, the electronic chip components are freely oriented in a width direction and a thickness direction thereof and are supported on only one side surface thereof, without fixing an orientation of a length direction of the electronic chip components;
the electronic chip components are put directly into the cavities from the feeding section of the feeder by providing suction in the cavities from a cavity side;
the feeder includes a sidewall at a peripheral edge of the transport surface;
the sidewall includes an opening portion; and
the opening portion in the sidewall is blocked by a cavity formation surface in which the cavities of the accommodating device are provided.

12. A handling device for electronic chip components as claimed in claim 11, wherein the feeder is a circulatory feeder in which the electronic chip components can be moved freely with any orientation thereof and the electronic chip components can be put into the cavities in a free order.

13. A handling device for electronic chip components as claimed in claim 11, wherein, when the electronic chip components are put into the cavities from the feeder, the electronic chip components are directly put into the cavities without being moved along a main surface of the accommodating device.

14. A handling device for electronic chip components as claimed in claim 11, wherein the accommodating device is a rotating disk-shaped device having a main surface, and the cavities are disposed so as to be located close to the feeder as a result of rotation thereof.

15. A handling device for electronic chip components as claimed in claim 14, wherein the accommodating device is disposed so that its rotation axis is in a substantially horizontal position.

16. A handling device for electronic chip components as claimed in claim 14, wherein the transport surface of the feeder has a descending inclination relative to the accommodating device and the main surface of the accommodating device is inclined such that an angle between the main surface of the accommodating device and the transport surface of the feeder increases.

17. A handling device for electronic chip components as claimed in claim 14, wherein the main surface of the accommodating device is inclined such that an angle between the main surface of the accommodating device and the transport surface of the feeder increases.

18. A handling device for electronic chip components as claimed in claim 11, wherein end portions of the electronic chip components put or waiting to be put into the cavities of the accommodating device protrude to the transport surface of the feeder.

19. A handling device for electronic chip components as claimed in claim 11, further comprising an obstacle arranged to disperse the electronic chip components being transported by the feeder such that a density of electronic chip components near the cavities of the accommodating device has a desired value.

20. A handling device for electronic chip components as claimed in claim 11, wherein electrical characteristics of the electronic chip components put into the cavities are measured.

21. A handling device for electronic chip components, comprising:
an accommodating device having a plurality of cavities arranged to put electronic chip components thereinto; and
a feeder arranged to supply the electronic chip components to the accommodating device; wherein
the feeder includes a transport surface arranged to transport the electronic chip components towards the plurality of cavities, and a feeding section arranged to feed the electronic components into the plurality of cavities;
the accommodating device is arranged to move such that at least one of the cavities is successively disposed at a location in close proximity to the feeding section of the feeder, and the electronic chip components are made to float in air by a floating unit of the feeder and, by providing suction in the cavities from a cavity side, the electronic chip components in the air are put directly into the cavities;
the electronic components are arranged in an arbitrary orientation on the transport surface of the feeder;
the feeder includes a sidewall at a peripheral edge of the transport surface;
the sidewall includes an opening portion; and
the opening portion in the sidewall is blocked by a cavity formation surface in which the cavities of the accommodating device are provided.

22. A handling device for electronic chip components as claimed in claim 21, wherein the feeder is a circulatory feeder in which the electronic chip components can be moved freely with any orientation thereof and the electronic chip components can be put into the cavities in a free order.

23. A handling device for electronic chip components as claimed in claim 21, wherein, when the electronic chip components are put into the cavities from the feeder, the electronic chip components are directly put into the cavities without being moved along a main surface of the accommodating device.

24. A handling device for electronic chip components as claimed in claim 21, wherein the accommodating device is a rotating disk-shaped device having a main surface, and the cavities are disposed so as to be located close to the feeder as a result of rotation thereof.

25. A handling device for electronic chip components as claimed in claim 24, wherein the accommodating device is disposed so that its rotation axis is in a substantially horizontal position.

26. A handling device for electronic chip components as claimed in claim 24, wherein the transport surface of the feeder has a descending inclination relative to the accommodating device and the main surface of the accommodating device is inclined such that an angle between the main surface of the accommodating device and the transport surface of the feeder increases.

27. A handling device for electronic chip components as claimed in claim 24, wherein the main surface of the accommodating device is inclined such that an angle between the main surface of the accommodating device and the transport surface of the feeder increases.

28. A handling device for electronic chip components as claimed in claim 21, wherein end portions of the electronic chip components put or waiting to be put into the cavities of the accommodating device protrude to the transport surface of the feeder.

29. A handling device for electronic chip components as claimed in claim 21, further comprising an obstacle arranged to disperse the electronic chip components being transported by the feeder such that a density of electronic chip components near the cavities of the accommodating device has a desired value.

30. A handling device for electronic chip components as claimed in claim 21, wherein electrical characteristics of the electronic chip components put into the cavities are measured.

31. A handling device for electronic chip components comprising:
  an accommodating device having a plurality of cavities arranged to put chip-type electronic components thereinto;
  a transport portion arranged to transport the electronic chip components to the cavities in the accommodating device;
  a first suction block having a transport passage linked to the transport portion and arranged to put the electronic chip components into the transport passage by a suction operation;
  a feeder arranged to supply the electronic chip components to a location in close proximity to an entrance of the transport passage of the suction block;
  and a second suction block arranged to put the chip-type electronic components into the plurality of cavities by providing suction in the cavities from a cavity side; wherein
  the feeder is a circulatory feeder in which the electronic chip components move freely with any orientation thereof in a free direction and the electronic chip components are supplied to the transport passage of the suction block in a free order;
  the feeder includes a sidewall at a peripheral edge of the transport surface;
  the sidewall includes an opening portion; and
  the opening portion in the sidewall is blocked by a cavity formation surface in which the cavities of the accommodating device are provided.

32. A handling device for electronic chip components, comprising:
  an accommodating device having a plurality of cavities arranged to put electronic chip components thereinto; and
  a feeder arranged to supply the electronic chip components to the accommodating device; wherein
  the feeder includes a transport surface arranged to transport the electronic chip components towards the plurality of cavities, and a feeding section in the feeder arranged to feed the electronic components into the plurality of cavities;
  the accommodating device is arranged to move such that at least one of the cavities is successively disposed at a location which is in close proximity to the feeder;
  the feeder is a circulatory feeder in which the electronic chip components move freely with any orientation thereof and the electronic chip components are supplied to the cavities in a free order;
  the electronic chip components are directly put into the cavities from the feeder without being moved along a main surface of the accommodating device by providing suction in the cavities from a cavity side;
  the feeder includes a sidewall at a peripheral edge of the transport surface;
  the sidewall includes an opening portion; and
  the opening portion in the sidewall is blocked by a cavity formation surface in which the cavities of the accommodating device are provided.

33. A handling method for electronic chip components, comprising the steps of:
  providing an accommodating device having a plurality of cavities;
  providing a feeder arranged to supply the electronic components to the accommodating device including a transport surface arranged to transport the electronic chip components towards the plurality of cavities, and a feeding section arranged to feed the electronic components into the plurality of cavities; and
  putting electronic chip components into the accommodating device from the feeder; wherein
  by performing a suction operation in at least one cavity disposed at a location which is in close proximity to the feeder, the electronic chip components are put directly into the cavities from the feeder without being moved along a main surface of the accommodating device;
  the electronic components are transported in an arbitrary orientation on the transport surface of the feeder;
  the feeder includes a sidewall at a peripheral edge of the transport surface;
  the sidewall includes an opening portion; and
  the opening portion in the sidewall is blocked by a cavity formation surface in which the cavities of the accommodating device are provided.

* * * * *